US008209579B2

(12) United States Patent
Belogolovy

(10) Patent No.: US 8,209,579 B2
(45) Date of Patent: Jun. 26, 2012

(54) GENERALIZED MULTI-THRESHOLD DECODER FOR LOW-DENSITY PARITY CHECK CODES

(75) Inventor: Andrey Vladimirovich Belogolovy, Saint Petersburg (RU)

(73) Assignee: Intel Corporation, Santa Clara, CA (US)

( * ) Notice: Subject to any disclaimer, the term of this patent is extended or adjusted under 35 U.S.C. 154(b) by 793 days.

(21) Appl. No.: 12/087,179

(22) PCT Filed: Dec. 26, 2005

(86) PCT No.: PCT/RU2005/000668
§ 371 (c)(1),
(2), (4) Date: Feb. 24, 2009

(87) PCT Pub. No.: WO2007/075098
PCT Pub. Date: Jul. 5, 2007

(65) Prior Publication Data
US 2009/0222711 A1    Sep. 3, 2009

Related U.S. Application Data

(63) Continuation-in-part of application No. PCT/RU2004/000123, filed on Mar. 31, 2004.

(51) Int. Cl.
*G06F 11/00* (2006.01)
(52) U.S. Cl. .................................................. 714/752
(58) Field of Classification Search .................. 714/752
See application file for complete search history.

(56) References Cited

U.S. PATENT DOCUMENTS

| 3,806,883 | A | 4/1974 | Weisbecker |
| 5,467,132 | A | 11/1995 | Fazel et al. |
| 5,481,614 | A | 1/1996 | Johnston |
| 5,550,837 | A | 8/1996 | Chang |
| 5,691,992 | A | 11/1997 | Molnar et al. |
| 5,819,212 | A | 10/1998 | Matsumoto et al. |
| 6,031,874 | A | 2/2000 | Chennakeshu et al. |
| 6,292,917 | B1 | 9/2001 | Sinha et al. |
| 6,363,513 | B1 | 3/2002 | Hekstra |
| 6,543,025 | B2 | 4/2003 | Hekstra |
| 6,614,858 | B1 * | 9/2003 | Pekarich et al. ............. 375/340 |
| 6,633,856 | B2 | 10/2003 | Richardson et al. |
| 6,665,831 | B1 | 12/2003 | Yoshida et al. |

(Continued)

FOREIGN PATENT DOCUMENTS
RU    2146850    3/2000
(Continued)

OTHER PUBLICATIONS

"U.S. Appl. No. 10/812,300 Notice of Allowance mailed Jun. 7, 2007", 8 pgs.

(Continued)

*Primary Examiner* — Philip Guyton
(74) *Attorney, Agent, or Firm* — Schwegman, Lundberg & Woessner, P.A.

(57) ABSTRACT

Methods, apparatus, and systems are provided for error correction of a communication signal. A generalized multiple threshold scheme for iteratively decoding a received codeword may include generating a bit reliability based on a channel output reliability and an updated bit reliability from a previous decoding iteration, where the bit reliability is updated using a scaling factor and a comparison with a threshold. The threshold may have a plurality of threshold values during the iterative decoding.

31 Claims, 9 Drawing Sheets

U.S. PATENT DOCUMENTS

| | | | |
|---|---|---|---|
| 6,694,474 | B2 | 2/2004 | Ramprashad et al. |
| 6,771,772 | B1 | 8/2004 | Tanrikulu |
| 6,854,082 | B1 | 2/2005 | Rhee |
| 7,190,732 | B2 | 3/2007 | Chung et al. |
| 7,231,577 | B2 * | 6/2007 | Richardson et al. .......... 714/758 |
| 7,237,181 | B2 * | 6/2007 | Richardson ................... 714/780 |
| 7,350,130 | B2 * | 3/2008 | Tran et al. ..................... 714/758 |
| 7,373,581 | B2 | 5/2008 | Okamura et al. |
| 7,716,561 | B2 * | 5/2010 | Belogolovyi et al. ......... 714/780 |
| 7,856,584 | B2 | 12/2010 | Ovchinnikov et al. |
| 8,015,468 | B2 | 9/2011 | Krouk et al. |
| 2002/0116677 | A1 | 8/2002 | Morelos-Zaragoza |
| 2003/0088820 | A1 | 5/2003 | Koppelaar |
| 2004/0168114 | A1 | 8/2004 | Richardson et al. |
| 2007/0011586 | A1 | 1/2007 | Belogolovyi et al. |
| 2007/0271496 | A1 | 11/2007 | Krouk et al. |
| 2008/0086670 | A1* | 4/2008 | Krouk et al. .................. 714/752 |
| 2008/0086672 | A1 | 4/2008 | Ovchinnikov et al. |
| 2010/0125769 | A1* | 5/2010 | Wang et al. ................... 714/752 |
| 2010/0146371 | A1* | 6/2010 | Efimov et al. ................. 714/780 |

FOREIGN PATENT DOCUMENTS

| | | |
|---|---|---|
| SD | 985959 | 12/1982 |
| TW | 200412722 A | 7/2004 |
| WO | WO-9419877 | 9/1994 |
| WO | WO-03063135 A1 | 7/2003 |
| WO | WO-2005096509 A1 | 10/2005 |
| WO | WO-2006073322 A1 | 7/2006 |
| WO | WO-2006073324 1 | 7/2006 |
| WO | WO-2006075929 A1 | 7/2006 |
| WO | WO-2006130033 A1 | 12/2006 |

OTHER PUBLICATIONS

"International Search Report for corresponding PCT Application No. PCT/RU2004/000123", (Jan. 31, 2005),6 pgs.

"Russian Application No. 2006138223 Office Action mailed Nov. 20, 2007", 6 pgs (Translated in English).

"Written Opinion of the International Searching Authority for the corresponding PCT Application No. PCT/RU2004/000123", (Jan. 31, 2005),10 pgs.

Bokolamulla, D. , et al., "Reduced Complexity Iterative Decoding for Concatenated Coding Schemes", *Proc. IEEE International Conference on Communications(ICC '03)*, 1(5), (May 11, 2003),3135-3139.

Deenick, Karl R., "Turbo Codes and Low-Density Parity-Check Codes", *University of Sydney, ELEC5505—Advanced Digial Transmission*, (Oct. 2001),1-7.

Djurdjevic, Ivana , "A class of low-density parity-check codes constructed based on Reed-Solomon codes with two information symbols", *IEEE Communications Letters*, 7(7), (Jul. 2003),317-319.

Fossorier, Marc P., et al., "Reduced Complexity Iterative Decoding of Low-Density Parity Check Codes Based on Belief Propagation", *IEEE Transactions on Communications*, vol. 47, No. 5, (May 1999),673-680.

Gallager, R. G., "Low-Density Parity Check Codes", *IRE Transactions on Information Theory*, (Jan. 1962),21-28.

Hu, Xiao-Yu , et al., "Regular and Irregular Progressive Edge-Growth Tanner Graphs", *Submitted to IEEE Transactions on Information Theory*, IBM Research, Zurich Research Laboratory,(2003),64 pgs.

Inaba, Y., et al., "Performance of low density parity check (LDPC) codes with bootstrap decoding algorithm on a fast fading channel", *IEEE 59th Vehicular Technology Conference, 2004. VTC 2004-Spring.*, (May 17-19, 2004),333-337.

Johnson, Sarah J., et al., "Low-density parity-check codes: Design and decoding", *Chapter in Wiley Encyclopedia of Telecommunications* (J. Proakis, Ed.), *Technical Report EE02041*, (Jun. 27, 2002),1-33.

Kou, Y , et al., "Low-density parity-check codes based on finite geometries: a rediscovery and new results", *IEEE Transactions on Information Theory*, 47(7),(Nov. 2001),2711-2736.

MacKay, D. J., et al., "Performance of Low Density Parity Check Codes as a Funcion of Actual and Assumed Noise Levels", *Electronic Notes in Theoretical Computer Science 74*(2003), URL:http://www.elsevier.nl/locate/entcs/volume74.html,8pgs.

Mehta, Gayatri , et al., "An FPGA Implementation of the Graph Encoder-Decoder for Regular LDPC Codes", *Connunications Research Laboratory Technical Report#8-4-2002-1*, Available from http://crl.ee.pitt.edu/TechnicalReports/CRL_August_2002.pdf,(Aug. 2002),1-18.

Neal, Radford M., "Sparse Matrix Methods and Probabilistic Inference Algorithms: Part 1, Faster Encoding for Low Density Parity Check Codes Using Sparse Matarix Methods", *IMA Program on Codes, Systems and Graphical Models, 1999*, Available from http://www.ima.unm.edu/talks/workshops/aug2-13.99/1neal/neal.pdf.,(Aug. 1999),16 pages.

Nouh, A. , et al., "Bootstrap Decoding of Low-Density Parity-Check Codes", *IEEE Communications Letters*, 6(9), (Sep. 2002),391-393.

Pukkila, M. , et al., "Turbo Equalization with Low Complexity Decoder", *Proceecings, IEEE 54th Vehicular Technology Conference(VTC' 2001)*, vol. 2,(Oct. 7, 2001), 1048-1052.

Richardson, T. , et al., "The Renaissance of Gallager's Low-Density parity-Check Codes", *IEEE Communications Magazine*, 41(8), ISSN: 0163-6804,(Aug. 2003),126-131.

Shokrollahi, Amin , "An Introduction to Low-Density Parity-Check Codes", *Theoretical Aspects of computer Science* (G.B. Khosrovshahi et al, eds.), *LNCS 2292, Springer-Verlag Berlin Heidelberg*, (2002),175-197.

Thorpe, Jeremy , "Code and Decoder Design for LDPC Codes for Gbps Systems", *Caltech student Powerpoint presentation to Microsoft Research*, Available from www.ee.caltech.edu/~jeremy/research/ presentations/LDPC-intro.ppt,(Nov. 25, 2002),33 pages.

"U.S. Appl. No. 11/577,035, Notice of Allowance mailed Aug. 12, 2010", 7 pgs.

"U.S. Appl. No. 11/577,035, Non-Final Office Action mailed Apr. 1, 2010", 11 pgs.

"U.S. Appl. No. 11/577,035, Response filed Jul. 1, 2010 to Non Final Office Action mailed Apr. 1, 2010", 14 pgs.

"U.S. Appl. No. 11/644,203, Response filed Feb. 14, 2011 to Non Final Office Action mailed Nov. 12, 2010", 13 pgs.

"U.S. Appl. No. 11/664,203, Non-Final Office Action mailed Nov. 12, 2010", 11 pgs.

"U.S. Appl. No. 11/664,203, Notice of Allowance mailed Apr. 29, 2011", 5 pgs.

"U.S. Appl. No. 11/664,203, Preliminary Amendment filed Mar. 29, 2007", 3 pgs.

"German Application Serial No. 112005003790.8, Office Action mailed Dec. 16, 2011", 10 pgs.

Gilbert, E N, "A problem in binary coding", In Proceedings of the Symposium in Applied Mathematics, vol. 10, (1960), 291-97.

Kou, Yu, "Low-Density Parity-Check Codes Based on Finite Geometries: A Rediscovery and New Results", (Nov. 2001), 2711-2736.

Kousa, M. A, et al., "Multichannel Adaptive System", IEEE Proceedings I. Solid-State & Electron Devices, Institution of Electrical Engineers, 140(5) Part-I, (Oct. 1, 1993), 357-364.

Krouk, E A, et al., "Low-density parity-check burst error-correcting codes", In 2nd International Workshop Algebraic and combinatorial coding theory, Leningrad, 1990., (1990), 3 pgs.

Kumar, V., et al., "On Unequal Errol TProtection LDPC Codes Based on Plotkin-type Constructions", Globecom 2004, Global Telecommunications Conference, IEEE Communications Society, (Nov. 29, 2004), 493-497.

* cited by examiner

GENERALIZED MULTI-THRESHOLD DECODER FOR LOW-DENSITY PARITY CHECK CODES

This application is a U.S. National Stage Filing under 35 U.S.C. 371 from International Patent Application Serial No. PCT/RU2005/000668, filed Dec. 26, 2005, and published on Jul. 5, 2007 as WO 2007/075098 A1, which is a Continuation-In-Part application of co-pending and commonly assigned application, PCT Application no. PCT/RU2004/000123, entitled: "MULTI-THRESHOLD RELIABILITY DECODING OF LOW-DENSITY PARITY CHECK CODES," filed 31 Mar. 2004, both of which are hereby incorporated by reference in their entirety.

RELATED APPLICATIONS

This application is related to the following, co-pending, and commonly assigned application: PCT/RU2004/000536, entitled: "CHANNEL ESTIMATION AND FIXED THRESHOLDS FOR MULTI-THRESHOLD DECODING OF LOW-DENSITY PARITY CHECK CODES," filed 28 Dec. 2004.

TECHNICAL FIELD

Embodiments of the invention relate generally to error correcting in communication signals.

BACKGROUND

A communication channel, whether it is a fiber optic channel, a co-axial channel, a wired channel, a wireless channel, or a bus connecting locations in a system over which large amounts of data are transferred, can add noise and error to information being transmitted over the channel. To correct for errors added by the communication channel, information can be sent in the form of codewords, where each codeword contains the same number of total bits and in which a number of the bits are information (message) bits and a number of bits are used for error correction. A codeword having a length of n bits includes k bits for the message length of the code and r=n−k redundant bits. The r bits are for correction and may be r parity check bits. A parity check matrix, H, contains a set of parity check equations that define the codeword according to the relation:

$$HC^T = 0,$$

where C is the n-dimensional vector of the codeword bits. At a receiver if this relation is not satisfied, then the received codeword is not valid and must either be corrected or retransmitted.

A variety of schemes for decoding a codeword that has propagated through a communication channel exist. Some schemes may provide accuracy, and other schemes may provide fast decoding. In high speed data communication what is needed is a decoding scheme that is accurate and fast, but at the same time can be implemented without a significant amount of complexity.

DETAILED DESCRIPTION

Figure 1:
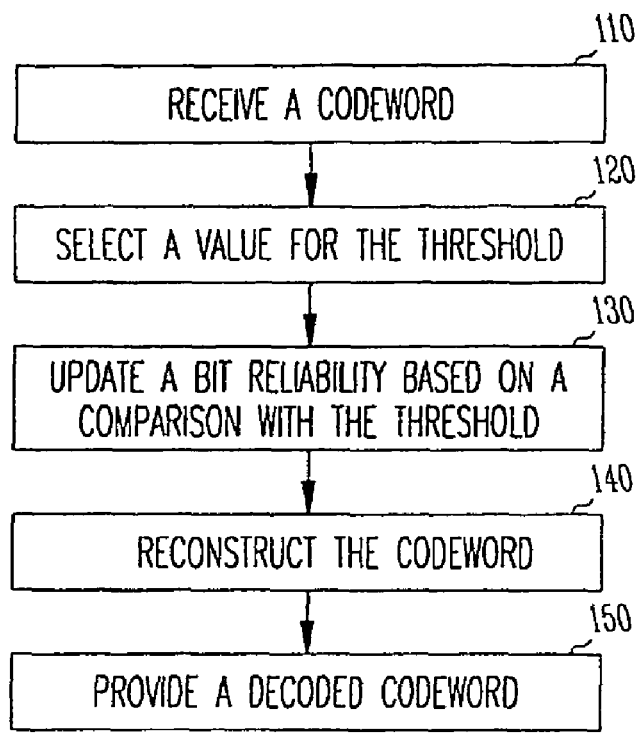
FIG. 1 shows a flow diagram of an embodiment of a method for iteratively decoding information received from a communication channel.

The following detailed description refers to the accompanying drawings that show, by way of illustration, specific details and embodiments in which the invention may be practiced. These embodiments are described in sufficient detail to enable those skilled in the art to practice the present invention. Other embodiments may be utilized and structural, logical, and electrical changes may be made without departing from the scope of the invention. The various embodiments disclosed herein are not necessarily mutually exclusive, as some disclosed embodiments can be combined with one or more other disclosed embodiments to form new embodiments. The following detailed description is, therefore, not to be taken in a limiting sense, and the scope of the embodiments of the present invention is defined only by the appended claims, along with the full scope of equivalents to which such claims are entitled.

Low-density parity check (LDPC) codes provide a powerful forward error correcting tool in high-speed communication systems due to the low decoding complexity and the bit-error rate (BER) achieved in an additive white Gaussian noise (AWGN) channel. Conventional LDPC decoders work using a one-threshold decoding scheme. Examples of known LDPC decoders include, among others, the min-sum algorithm, the a posteriori probability (APP) decoding algorithm, and the uniformly most powerful (UMP) decoder.

LDPC codes use a parity check matrix containing mostly zeros and a limited number of ones. A binary (n, γ, ρ) LDPC code has a codeword length, or block length, of n bits and a parity check matrix with exactly γ ones in each column and exactly ρ ones in each row. In the LDPC code, each code bit is checked by γ parity checks and each parity check uses ρ code bits. Further, the code has a rate, R, defined as R=k/n, where k is the number of message (information) bits in the codeword having n bits.

An iterative decoding process may include checking as to whether or not the parity check equation for each received bit from a channel is satisfied. If all the parity check equations are satisfied, the received bits are taken to be the codeword transmitted. If the majority of parity check equations for a given received bit are not satisfied, the given received bit may be flipped; otherwise the value of the given received bit is maintained. Flipping a bit means changing a zero to a one or a one to a zero. After the codeword is reconstructed with the flipping of a bit, the parity check equations are again checked. If all the parity check equations are satisfied, the received bits are taken to be the codeword transmitted, otherwise the iterative procedure continues until a maximum number of allowed iterations is reached.

In LDPC decoding, a belief propagation decoding (BPD) algorithm can be employed using probabilistic values. Typically, iterative decoding of an LDPC code deals with determining the most likely vector x, where $Hx^T \mod 2=0$. The likelihood of x may be given by the product of probabilities that for each bit location, n, $x_n=x$. For a binary codeword, x takes of the value of 0 and 1, so that the probability that x=1 equals one minus the probability that x=0. Further, the probabilistic values may be represented by log-likelihood ratios. For a binary signal with p defined as the probability of a 1, then a log-likelihood ratio (LLR) can be given by $LLR(P)=\log_e((1-p)/p)$.

Sum-product decoding performs decoding using LLR values.

With respect to the process regarding flipping a received bit discussed above, an initial hard decision was made on the signal received from the communication channel. A hard decision is made on a bit by evaluating that bit individually. For a hard decision for a binary bit, the decoder makes the bit a 1 or a 0 if the bit is less than or greater than a fixed value set by the decoder. With the fixed value set by the decoder at zero, a hard decision would set a bit equal to 1 if the received signal for the bit is positive and set the bit equal to 0 if the received signal is negative. Alternately, a hard decision may set a bit equal to 1 if the received signal for the bit is negative and set the bit equal to 0 if the received signal is positive.

A soft decision is one in which the likelihood that a bit should represent a one or zero is taken into account when determining the value of the bit from the received signal. Soft decision decoders may use information relating to the confidence of the received signal (soft received information) and knowledge of the properties of the channel to provide probabilistic expressions for a received signal relative to the transmitted signal. While a hard decision for a binary process provides a hard decision vector where the vector locations, or vector bits, are either a one or a zero, a soft decision may provide a hard decision vector and a reliabilities, or bits reliabilities, vector. The binary hard decision vector provided by the soft decision is a vector of ones and zeros, where each vector bit is generated individually with respect to a fixed criteria. The reliabilities vector includes a set of bit reliabilities, each bit reliability corresponding to a bit of the associated hard decision vector. The bit reliability provides a measure of its confidence of the corresponding bit in the hard decision vector. The bit reliability may tale the form of a probability, a log-likelihood ratio, or other weighted factor correlated to the communication channel through which a received codeword is transmitted. A bit reliability may be correlated directly to the magnitude of the signal representing a received bit.

As is known to those skilled in the art, various decoding schemes implement soft decoding schemes using probabilities. One scheme in its soft decision processes computes the a posteriori probability for each codeword bit, which is the probability that the given bit is a one conditioned on the event that all parity check constraints are satisfied. An intrinsic or a priori probability is the bit probability independent of code constraints and an extrinsic probability represents what has been learnt. For example, in a sum-product algorithm for decoding, a log-likelihood ratio, LLR, of a received signal representing a bit is set based on knowledge of the channel. For an AWGN channel with a signal-to-noise ratio, SNR, the initial LLR for that bit may be set to $$LLR_i = \frac{2Y_i}{\sigma^2},$$

where $Y_i$ is the received signal, σ is the AWGN standard deviation. The standard deviation can be defined via AWGN SNR as $$\sigma = \sqrt{\frac{n}{2 \cdot 10^{SNR/10} \cdot k}},$$

where n is the code length, k is the message length, and SNR is the SNR per message bit. The $LLR_i$ are functionally related to the reliability, $R_i$, of bit i. The reliability is a measure of the confidence in the value of the bit. Iterative decoding in various schemes includes updating the reliability corresponding to received bits, and/or updating the reliability corresponding to non-zero elements of the parity check matrix, H. Such iterative processes including checking an updated test codeword, x, for validity via the relation, $Hx^T=0$. If the test does not result in a valid codeword, the iterative process continues until a valid codeword is obtained or a maximum number of iterations is made.

In an embodiment, a multi-threshold decoder is constructed to provide an iterative decoding algorithm with reduced complexity and good error-correcting properties for decoding LDPC codes from a soft-output channel. This embodiment for a multi-threshold reliability decoder for fast LDPC decoding operates using a soft channel output, a soft decision, to produce a hard-decision vector and a reliabilities vector of the bits received. The bit reliabilities are used to calculate parity check reliabilities, and an overall parity check reliability is set at a minimum bit reliability value of all bits which are involved in a given parity check. To recalculate bit reliabilities a weighted parity check voting procedure is used, where the weights are the parity check reliabilities. In such embodiments, as the weight of the parity check weight is decreased, the decoding quality is increased. Initially, the bit reliability is assigned to a bit reliability correlated to the value of the bit received. The parity check voting is applied to the current hard-decision vector. Based on the parity check voting compared with a threshold value at the given iteration, the bit reliability is set to a recalculated bit reliability that is increased by a parity check reliability value; otherwise the recalculated bit reliability is decreased by the parity check reliability value.

For each iteration, threshold values are provided, where the threshold values may be calculated during one or more iterations. The threshold values are used for making the decisions as to whether a bit and its associated reliability should be updated. If a particular reliability is less than the threshold value, then the hard decision bit associated with the reliability is inverted and its new reliability is assigned to the absolute value of the recalculated reliability. The decoding scheme is iterative, and the thresholds may differ from one iteration to another, where at least two values of the threshold are provided or scheduled for calculation during the decoding process. Though the thresholds may be calculated during the iteration, these values also may be predefined. In another embodiment, at the first iteration the error-decision threshold is set to the smallest of the bit reliabilities, and then, at all other iterations, the error-decision threshold is set to zero. In this embodiment, tie multi-threshold decoding scheme would be a decoding scheme using two thresholds. The two threshold scheme leads to 0.1-0.4 dB bit error rate gain compared to fast decoding without a threshold having multiple values.

An embodiment for a novel scheme that can be implemented in LDPC decoders includes a multi-threshold decision scheme. By multi-threshold decision scheme, it is meant that a threshold value is changed to a computed value or a predefined value during one or more decoding iterations. In an embodiment, during the first iteration a maximum threshold value (by absolute value) is used acid in following iterations, a change of threshold is applied in which the threshold decreases. Changing the threshold values allows the use of a high threshold value dining the first iteration leading to an absence, or reduction, of error propagation. Thus, if the decoder corrects even a small number of errors, the decoding at following iterations becomes significantly easier. Use of an embodiment of the multi-threshold decoding scheme may lead to a decrease in the number of iterations made during decoding. These embodiments may be realized with a decoding bit error rate close to that of a maximum a posteriori (MAP) decoding scheme.

In an embodiment, a multi-threshold decoder provides an iterative decoder that uses a soft-decision input vector to generate a hard decision vector and its associated reliabilities vector that describes the absolute likelihood value of every bit. At every iteration, the decoder computes the reliability of every parity check equation using the bit reliabilities. Then, for every bit and every parity check, if a parity check equation failed, the corresponding bit reliability (corresponding to a bit or parity check equation) is decreased; otherwise the bit reliability is increased. When all equations are checked, a hard decision is made using the following rule: if the updated bit reliability is greater than a threshold value, the bit and its reliability stay unchanged, otherwise the bit is flipped (inverted), and its reliability is changed as a function of the updated reliability and threshold value. If the updated reliability is less than 0 but larger than the threshold value at that iteration, then the new bit reliability is set to 0. The threshold value is scheduled to be updated at least once during the decoding process. The process is repeated until the codeword is reconstructed or the decoder reaches the maximum allowed number of iterations.

FIG. 1 shows a flow diagram of an embodiment of a method for iteratively decoding information received from a communication channel. At 110, a codeword is received. The codeword may contain a number of information, or message, bits acid a number of bits for use in error detection and/or correction. At 120, a value for a threshold is selected. In an embodiment, a value for the threshold is selected using bit reliabilities correlated to the received codeword during each iteration. The selection may be conducted by calculating a minimum comparison reliability, initially constructed from a soft decision process performed on the received codeword that generates a hard decision vector and a reliabilities vector. The bit reliabilities may be correlated to the communication channel. In an embodiment, the bit reliabilities are generated using known, calculated, or estimated properties of the communication channel, such as, but not limited to, the signal to noise ratio associated with signals propagating through the communication channel. In another embodiment, a set of bit reliabilities is initially correlated to a set of received bits, such as, but not limited to, the absolute value of the signal received for each bit position. In an embodiment, the threshold call be selected as one of a pre-determined set of values, where the selection depends on the given code construction, SNR of the channel, and decoding iteration number.

At 130, a bit reliability that has been generated from the received codeword is updated based on a comparison with the threshold value. In various embodiments, a set of bit reliabilities may be generated, compared with the threshold, and updated. At 140, the codeword is reconstructed based on comparisons of computed bit reliabilities with the threshold, where the computed bit reliabilities are derived from the initially generated bit reliabilities. If the reconstructed codeword does not pass a validity test, the process continues with another iteration. The reconstructed codeword may be generated by inverting one or more bits of the version of the codeword in the given iteration. At 150, a reconstructed codeword is provided at the end of the iterative decoding process. If the decoding process is successful, the reconstructed codeword is taken to be the codeword provided at a transmitting location at another end of the communication channel. If the iterative decoding process does not provide a valid codeword at the end of a number of iterations, a retransmission of the codeword would be appropriate. In an embodiment, the method is used to decode an LDPC codeword.

Figure 2:
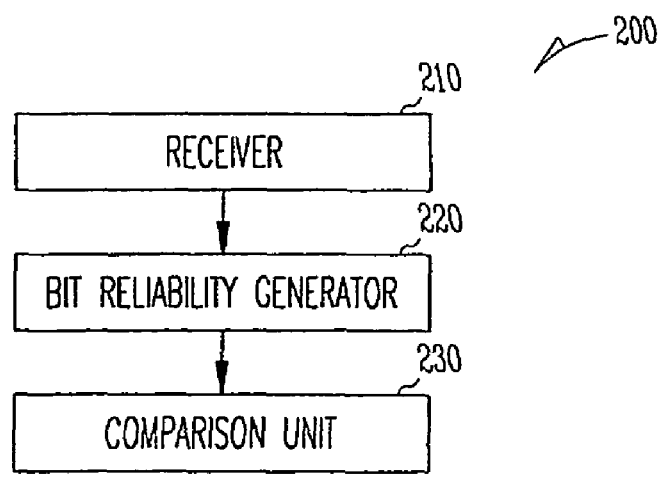
FIG. 2 illustrates an embodiment of an apparatus for iteratively decoding information received from a communication channel.

FIG. 2 illustrates an embodiment of an apparatus 200 for iteratively decoding information received from a communication channel. Apparatus 200 includes a receiver 210, a bit reliability generator 220, and a comparison unit 230. Receiver 210 acquires data from a communication channel. In an embodiment, the acquired data is in the form of bits in a signal stream, where the bits define a codeword. Alternately, receiver 210 may receive a signal and convert the received signal to a codeword. Bit reliability generator 220 generates one or more bit reliabilities associated with the codeword received. In an embodiment, initial bit reliabilities are generated based on the received codeword and a likelihood ratio related to the probabilities that a binary signal is a one or a zero. Such bit reliabilities may also be correlated to a signal-to-noise ratio of the communication channel from which the received codeword is received. Alternately, initial bit reliabilities call be generated from the received codeword such as by setting the initial bit reliabilities to the absolute value of the received codeword for each bit.

Comparison unit 230 compares bit reliabilities generated from bit reliability generator against a threshold. Subsequent to this comparison, comparison unit 230 updates the bit reliabilities and the bits of a test codeword depending on the results of the comparison with a value of the threshold. Comparison unit 230 uses multiple values for the threshold, depending on a current iteration in the decoding process. The updated bits of the test codeword are evaluated to determine if the updated bits have provided a valid codeword. If a valid codeword has been generated, comparison unit 230 may output the valid codeword or extract the information (message) bits from the codeword and output the message. Comparison unit 230 may be realized in a hardware configuration or in a software configuration. In an embodiment, the values for the threshold used by comparison unit 230 are set according to the iteration in which the value is used. A table of thresholds can be used associating a pre-determined value with an iteration number specified for a given code constriction and a given situation in the channel such as the SNR of the channel. In another embodiment, the values for the threshold used by comparison unit 230 are set using the bit reliabilities and the result of a comparison with the threshold value set for the decoding iteration at which comparison unit 230 is operating. In an embodiment, the apparatus 200 decodes an LDPC codeword.

Figure 3:
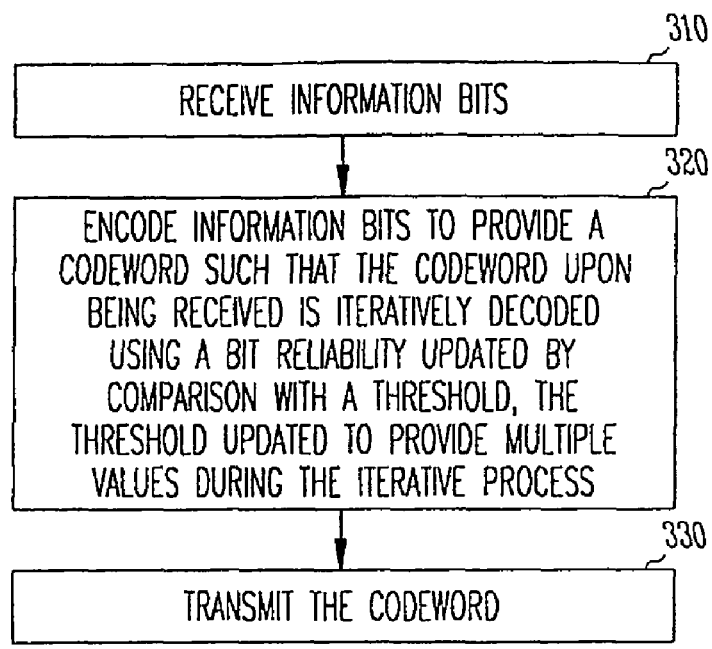
FIG. 3 shows a flow diagram of an embodiment of a method for encoding information to transmit a codeword representative of the information onto a communication channel.

FIG. 3 shows a flow diagram of an embodiment of a method for encoding information to transmit a codeword representative of the information onto a communication channel. At 310, information is received at an encoder in the form of information bits. At 320, the information bits are encoded to provide a codeword. The encoding is realized in a manner such that a version of the encoded codeword upon being received is iteratively decoded using a bit reliability updated by comparison with a threshold, where the threshold is updated to provide multiple values during the iterative process. If the version of the codeword is received without error at another end of the communication channel on which the codeword was transmitted, the iterative decoding may provide the codeword without correcting the received version of the codeword. If the received version of the transmitted codeword includes errors, the iterative decoding process using multiple thresholds provides a correction process. At 330, the codeword is transmitted onto the communication channel. In an embodiment, the method is used to encode an LDPC codeword.

Figure 4:
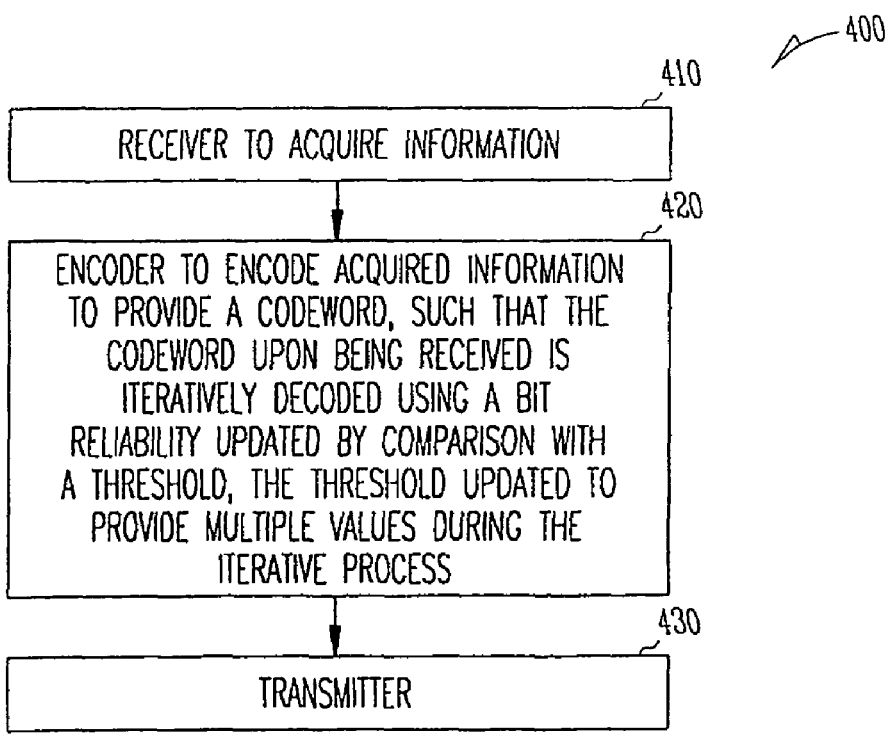
FIG. 4 illustrates an embodiment of an apparatus for encoding information that is iteratively decoded using multiple values for a threshold at a receiving end of a communication channel.

FIG. 4 illustrates an embodiment of an apparatus 400 for encoding information that is iteratively decoded using multiple values for a threshold at a receiving end of a communication channel. Apparatus 400 includes a receiver 410 to acquire information to encode, an encoder 420, and a transmitter 430. Receiver 410 acquires data provided to apparatus 400 to transmit over a communication channel. Encoder 420 takes the information and generates an encoded word that contains information, message bits and bits for correction at a receiving end of a transmission channel. The information supplied to encoder 420 may be in the form of information bits. Alternately, encoder 420 may take the supplied information and construct the information bits. Encoder 420 encodes the information into a codeword such that a version of the codeword upon being received is iteratively decoded using a bit reliability updated by comparison with a threshold. The threshold is updated to provide multiple values during the iterative process. Transmitter 430 sends the encoded codeword onto a communication channel.

The communication channel between apparatus using an embodiment of a decoding method using multiple thresholds and apparatus using an embodiment of an encoding method associated with the decoding method may include, but is not limited to, a fiber optic channel, a wired channel, a channel reading data stored on a memory unit, or a wireless channel. Additionally, embodiments for decoding and encoding may be adapted for use with any protocol for transmission over any communication channel.

Figure 5:
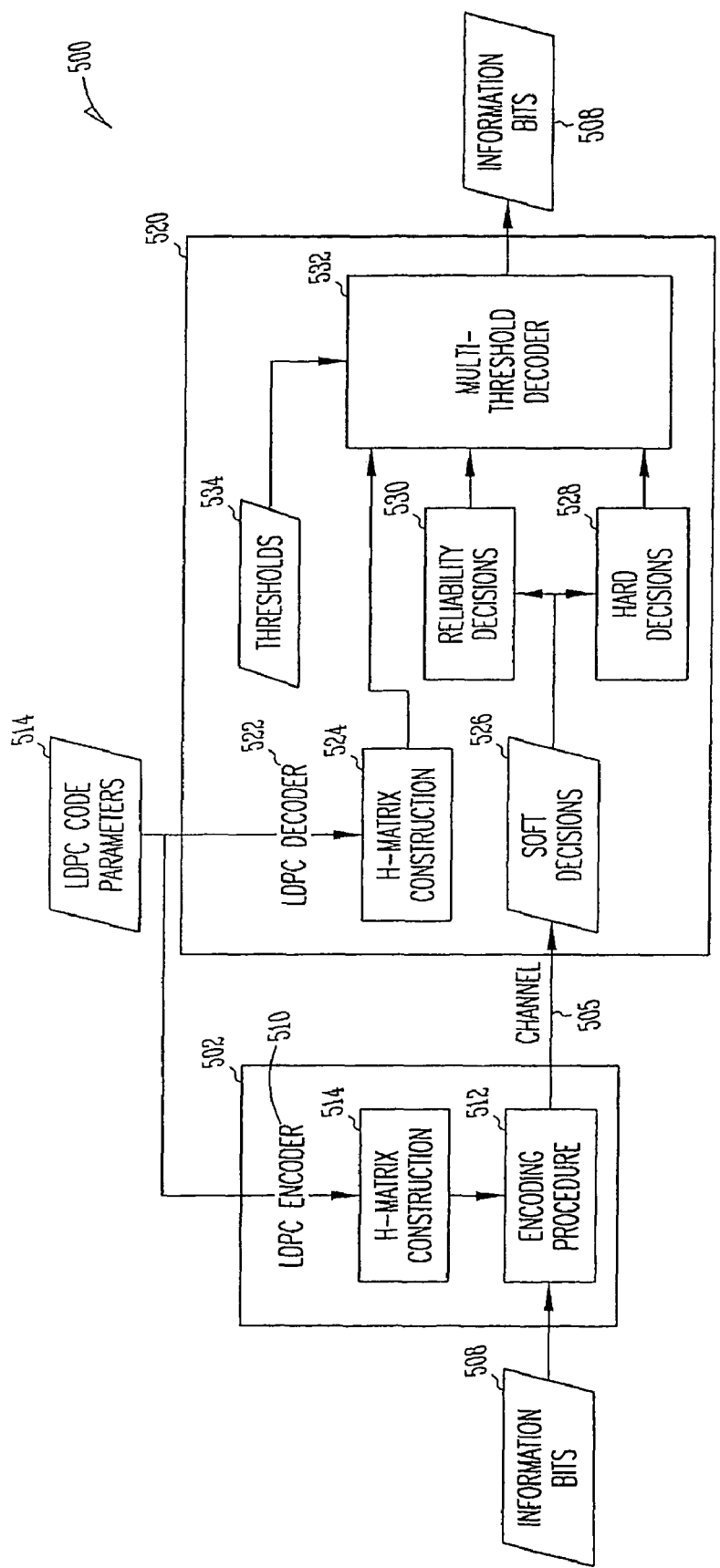
FIG. 5 illustrates a block diagram of an embodiment of a communication network having a system for encoding a low-density parity check codeword and a system for decoding a version of the encoded low-density parity check codeword received from a communication channel between the two systems.

FIG. 5 illustrates a block diagram of an embodiment of a communication network 500 having a system 502 for encoding a low-density parity check codeword and a system 520 for decoding a version of the encoded low-density parity check codeword received from a communication channel 505 between the two systems. An information source provides information bits 508 to an LDPC encoder 510 of system 502. LDPC encoder 510 includes an encoding procedure 512 that uses a H-matrix construction 514 to generate a codeword that is transmitted onto channel 505. H-matrix construction 514 is developed using LDPC code parameters 514 that are provided to system 502 and system 520.

System 520 includes an LDPC decoder 522 that uses LDPC code parameters 514. The LDPC code parameters are used by the H-matrix construction 524 in LDPC decoder 522. A received codeword from channel 505 is provided to an initial decision unit 526 to make soft decisions resulting in hard decisions 528 and reliability decisions 530. Hard decisions 528 are the initial binary bits for a test codeword and reliability decisions are initial bit reliabilities associated with the bits of the test codeword. In an embodiment, hard decisions 528 are binary bits set according to the sign of the corresponding bit of the received codeword. A received bit having a positive value is set to a one and a received bit having a zero value or a negative value is set to zero. Alternately, a received bit having a zero value or a positive value is set to a zero and a received bit having a negative value is set to one. The initial bit reliabilities for each bit of the received codeword may be set to the absolute value of the corresponding bit of the received codeword.

Hard decisions 528, reliability decisions 530, H-matrix construction 524 are provided to a multi-threshold decoder 532 to conduct an iterative decoding process to provide information bits 508 from system 520. Multi-threshold decoder 532 uses thresholds 534 against which constructed reliabilities are compared, and bit reliabilities are updated and bits for a test codeword are updated. The constructed reliabilities are developed from the bit reliabilities. In an embodiment, the constructed reliabilities are developed from the initial reliability decisions and calculated check sums. The bits for a test codeword are generated from hard decisions 528 with bits flipped according to the comparisons with the value of the threshold at each iteration. In an embodiment, thresholds 534 are calculated based on the comparison of the constructed bit reliabilities and the value of the threshold for a given iteration. In an embodiment, one set of thresholds 534 are calculated based on the comparison of the constructed bit reliabilities and the value of the threshold for a given iteration and used in a number of other iterations. A second set of thresholds 534 is set at a fixed value, such as zero, and is used in a number of other iterations. The fixed value for the threshold is used in the group of iterations that form the last iterations in the decoding process. Alternatively, thresholds 354 are set at pre-determined values depending on the iteration in which the value of the threshold is used.

Various embodiments for communication network 500, system 502, and system 520 may be realized. Communication network 500 may be a land based network using optical fibers, coaxial cable, or wires as a medium for the communication channels between various nodes of communication network 500. Communication network 500 may be realized as a wireless network in which systems 502 and 520 are configured as part of a node of communication network 500 or as part of a wireless receiving device that receives signals from the nodes of communication network 500. System 502 and system 520 may be configured as part of, but not limited to, network components such as base stations and may be configured as part of, but not limited to, wireless receiving devices such as handheld communication devices, computers, and laptop computing devices. Though not shown, systems 502 and 520 configured in a wireless communication system 500 include antennas for transmitting and receiving signals that include one more codewords. The decoding and encoding schemes and apparatus do not limit the type or configuration of supporting components such as antennas in the 502, 520 systems. In an embodiment, a substantially omnidirectional antenna is utilized.

Each node of communication network 500 configured as a land based network or as a wireless based network may contain a version of system 502 and/or a version of system 520 or a system that is a combination of system 502 and system 520. Additionally the decoding and encoding processes used in the encoders and decoders of system 502 and system 520 and other embodiments for decoding and encoding processes and apparatus as described herein may be adapted for the communication standards and protocols used in communication network 500.

Figure 6:
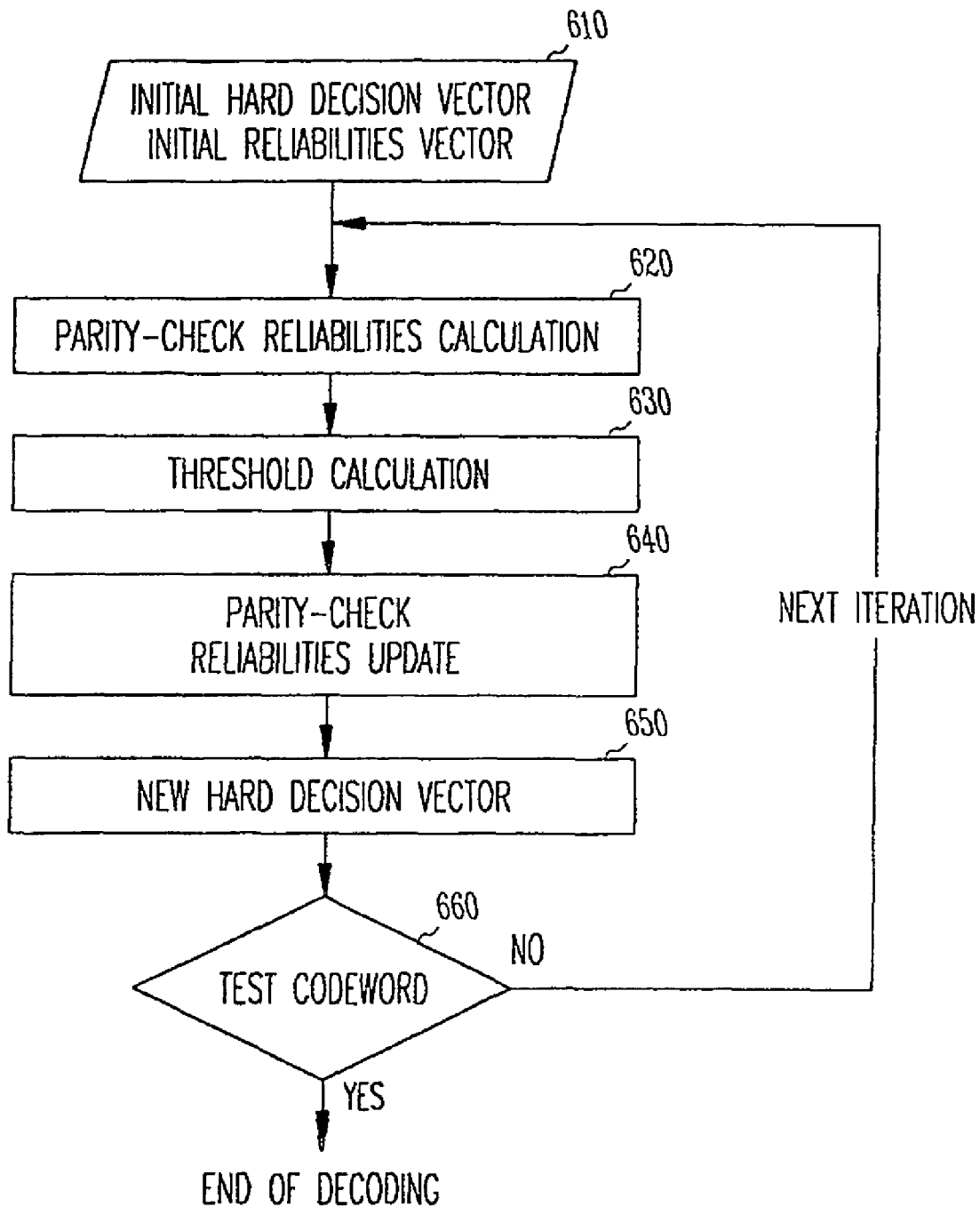
FIG. 6 illustrates a flow diagram of an embodiment of a method for iteratively decoding a low density parity check codeword using a decoder that may be configured as in FIG. 5.

FIG. 6 illustrates a flow diagram of an embodiment of a method that can be used with an LDPC decoder, such as LDPC decoder 522 as configured as in FIG. 5. At 610, all initial hard decision vector and an initial reliabilities vector is constructed. For a received codeword, $Y=(Y_1, Y_2, \ldots, Y_n)$, let $N(m)$ be the set of codeword positions that are used in an $m^{th}$ parity check: $N(m)=\{n:H_{m,n}=1\}$, where H is the parity check matrix such as provided from H-matrix construction 524 in FIG. 5 and $H_{m,n}=1$ means the value of the H matrix at the m,n position equals one. Further, let $M(n)$ be the set of parity checks that includes $n^{th}$ codeword position: $M(n)=\{m:H_{m,n}=1\}$.

At initialization, for every element, $Y_i$, of the received vector such as received at the LPDC decoder 522 of FIG. 5, a hard decision $X_i$ and a bit reliability $R_i$ are computed. The bit reliability $R_i$ is set to the absolute value of $Y_i$. The hard decision may set $X_i$ equal to one if $Y_i$ is greater than zero, and $X_i$ equal to zero if $Y_i$ is less than or equal to zero. For every $m \in M(n)$, a parity check bit reliability is defined as $Y_{mn}$, where initially $Y_{mn}=R_n$, and an associated hard decision is defined as $X_{mn}$, where initially $X_{mn}=X_n$.

After the initialization, at 620, an iterative process begins with performing a parity check reliabilities calculation. In an embodiment, for each n and each $m \in M(n)$, check sums, $S_{mn}$ are calculated as:

$S_{mn}=X_n \oplus \Sigma X_{mn'}$, mod 2, where the summation is over n' $\in N(m) \backslash n$. An expression $N(m) \backslash n$ means a set $N(m)$ where bit n is excluded. A value for the minimum of $Y_{mn}$ is identified as:

$Y_{mn\ min}=\min\{Y_{mn'}\}$ for $n' \in N(m) \backslash n$.

At 630, a threshold is calculated. In an embodiment, the threshold is set to the minimum value, over all n, of the set of an updated bit reliabilities defined for each n as, $Z_n=R_n+\Sigma(-1)^{Smn}Y_{mn\ min}$ for $m \in M(m)$.

These updated bit reliabilities will also act as comparison reliabilities in the decoding process. In an embodiment, the multi-value threshold is provided by computing a value for the threshold during each iteration of the decoding process. This is an adaptive approach. In an embodiment, the multi-value threshold may be provided by computing a value for the threshold during the first iteration using the updated bit reliabilities and provided as a fixed value, such as zero, for the remaining iterations. In an embodiment, the multi-value threshold may be provided by computing a value for the threshold during the first iteration using updated bit reliabilities and using that value for the first half of the total number of iterations, and, then, using a fixed value, such as zero, for the last half of the total iterations.

In an embodiment, the multi-value threshold may be provided by using a pre-determined set of thresholds, where the value used is correlated to the iteration number in which it is applied. In an embodiment, pre-determined values are assigned according to parameters of the communication channel from which the received codeword is acquired. These parameters may include a set of signal-to-noise ratios, a set of other channel parameters, or a set of standard deviations correlated to channel parameters. In an embodiment, the pre-determined set of thresholds may be determined through a simulation process. One such process may include simulating the decoding process to provide a set of thresholds for a given signal-to-noise ratio, and setting the threshold for the given signal-to-noise ratio as the mean of the set of simulated thresholds. The process can be conducted for each signal-to-noise ratio in a set of signal-to-noise ratios. Other statistical variations in simulated thresholds for the decoding process may be implemented. These pre-determined values, from whichever embodiment is used to provide these values, may be stored in a table. In addition to software implementation, these tables facilitate hardware implementations using a short lookup table.

In an embodiment, the thresholds are selected for multiple operating modes for decoding. In one mode, the decoding corrects one or two errors. In this mode, the decoding process does not insert additional errors in a codeword vector. In another mode, the decoding process corrects more than one error in one iteration, and may correct one to two errors in a subsequent iteration.

Various combinations for providing the multiple threshold values during the iteration process can be used depending on the allowable complexity desired for a given application.

At 640, parity check bit reliability updating is performed. A set of comparison reliabilities are computed with contribution from the parity check reliabilities, which can be viewed as parity check voting. For each n and each $m \in M(n)$, $Z_{mn}$ is defined as $Z_{mn}=R_n+\Sigma(-1)^{Sm'n}Y_{m'n\ min}$ for $m' \in N(n) \backslash m$.

For each n, the parity check bit reliabilities are updated as are the associated hard decisions $X_{mn}$ based on the comparison reliabilities, $Z_{mn}$. Updating a reliability or a hard decision includes maintaining the value of the reliability or the hard decision, if the comparison indicates that the reliability or the hard decision should remain the same.

$$Y_{mn} = \begin{cases} Z_{mn}, & Z_{mn} > 0 \\ -Z_{mn}, & Z_{mn} < \text{threshold} \\ 0; & \text{otherwise} \end{cases}$$

-continued $$X_{mn} = \begin{cases} X_{mn}, & Z_{mn} > \text{threshold} \\ 1 - X_{mn}, & Z_{mn} < \text{threshold} \end{cases}$$

At 650, a new hard decision vector, C, is generated based on the comparison reliabilities, or updated bit reliabilities, $Z_n$, as $$C_i = \begin{cases} X_i, & Z_i > 0 \\ 1 - X_i, & Z_i < 0. \end{cases}$$

Updating a bit includes maintaining the value of the bit, if the comparison indicates that the bit should remain the same. The terms $C_i$ provide the bits of a test codeword to determine if a valid codeword has been generated. At 660, the test codeword is evaluated for validity. If the following relation occurs, $$CH^T \neq 0,$$

the iterative process returns to 620 using the updated parity check reliability values.

Another embodiment of a method for iteratively decoding an LDPC codeword using a threshold having multiple values includes having the threshold take on only two values during the iteration process. A first value is set at the minimum of the updated reliabilities, $Z_n$, for the $Z_n$ generated in the first iteration prior to malting decision comparisons. A second value is set at zero for subsequent iterations. Such an embodiment provides a 0.5 dB gain in decoding time comparing to other known fast decoding schemes having substantially the same complexity.

Embodiments for a multiple threshold scheme decode any LDPC code in every situation. However, for a predefined code and known channel properties, the thresholds can be selected more precisely. In the various embodiments, the number of iterations may be taken to be $\log_2 n$, where n is codeword length. This provides a maximum number of iterations to perform before terminating the iteration prior to reconstructing a valid codeword. Experiments show that threshold truing and optimization provide enhanced BER gain, but finding the exact dependency of thresholds, code structure, and channel properties is application dependent.

Various embodiments or combination of embodiments for apparatus and methods for decoding and encoding communication signals using a multiple-threshold scheme, as described herein, can be realized in hardware implementations, software implementations, and combinations of hardware and software implementations. These implementations may include a computer-readable medium having computer-executable instructions for performing a decoding and/or encoding method using an embodiment for a scheme using multiple thresholds for iterative decoding. The computer-readable medium is not limited to any one type of medium. The computer-readable medium used will depend on the application using an embodiment of the multiple thresholds scheme. In an embodiment, a processor coupled to a receiver and/or transmitter may utilize various forms of memory to which it is coupled and the computer-readable medium to direct decoding and/or encoding of information for data transmission. In an embodiment, the memory may store parameters used to iteratively decode the received codeword.

Though an embodiment of a method using a multi-valued threshold can be used with any LDPC code, the following is presented as a non-limiting example. This example provides an embodiment of a decoding method using a multi-threshold decoder on a low-density parity check code based on Reed Solomon codes with two information symbols (RS-LDPC code). This is an example of a (n, γ, ρ) RS-LDPC code with n=32, γ=4, and ρ=3, with a rate, R, of approximately 0.4, and parity check matrix:

$$H_{RS-LDPC} = \begin{matrix} 10000000 & 10000000 & 10000000 & 10000000 \\ 00001000 & 00000010 & 00000100 & 01000000 \\ 00000100 & 00000001 & 00000010 & 00100000 \\ 00000010 & 01000000 & 00000001 & 00010000 \\ 00000001 & 00100000 & 01000000 & 00001000 \\ 01000000 & 00010000 & 00100000 & 00000100 \\ 00100000 & 00001000 & 00010000 & 00000010 \\ 00010000 & 00000100 & 00001000 & 00000001 \\ 10000000 & 00001000 & 00000001 & 01000000 \\ 00001000 & 00000001 & 01000000 & 10000000 \\ 00000100 & 00000010 & 00001000 & 00000010 \\ 00000010 & 00010000 & 10000000 & 00001000 \\ 00000001 & 00000100 & 00000100 & 00010000 \\ 01000000 & 01000000 & 00010000 & 00000001 \\ 00100000 & 10000000 & 00100000 & 00100000 \\ 00010000 & 00100000 & 00000010 & 00000100 \\ 10000000 & 00000100 & 01000000 & 00100000 \\ 00001000 & 00010000 & 00000001 & 00000010 \\ 00000100 & 01000000 & 00100000 & 10000000 \\ 00000010 & 00000001 & 00000100 & 00000001 \\ 00000001 & 00001000 & 10000000 & 00000100 \\ 01000000 & 00000010 & 00000010 & 00001000 \\ 00100000 & 00100000 & 00001000 & 01000000 \\ 00010000 & 10000000 & 00010000 & 00010000 \end{matrix}$$

For this example the received vector, $Y = \{Y_i\}$ has a codeword length of 32:
+0.22 +1.47 +0.52 +0.83 −2.38 +0.71 +1.44 −1.95
+0.08 −0.14 +1.19 +0.19 −1.86 −0.16 +0.94 +0.05
+1.01 −0.42 +0.78 −1.54 −0.84 +1.44 +1.65 −0.45
+0.94 −2.08 −1.31 +1.91 −0.69 +1.04 +1.39 +0.83

In this embodiment, the number of iterations is set at $\log_2 n$, where n is the codeword length. For n=32, the number of iterations is 5. Thresholds for iterations 1, 2, and 3 are set at the minimum of the updated bit reliabilities, $Z_n$, computed in the first iteration. The thresholds for iterations 4 and 5 are set at 0.

At initialization the hard decision vector, $X = \{X_i\}$ is
1111011010110011
1010011010010111 the bit reliabilities, $R_i$, are
+0.22 +1.47 +0.52 +0.83 +2.38 +0.71 +1.44 +1.95
+0.08 +0.14 +1.19 +0.19 +1.86 +0.16 +0.94 +0.05
+1.01 +0.42 +0.78 +1.54 +0.84 +1.44 +1.65 +0.45
+0.94 +2.08 +1.31 +1.91 +0.69 +1.04 +1.39 +0.83 and the parity check reliabilities are initially set as $Y_{mn}$:
Y[0, 0]=+0.22 Y[0, 8]=+0.08 Y[0, 16]=+1.01 Y[0, 24]=+0.94

Y[1, 4]=+2.38 Y[1, 14]=+0.94 Y[1, 21]=+1.44 Y[1, 25]=+2.08
Y[2, 5]=+0.71 Y[2, 15]=+0.05 Y[2, 22]=+1.65 Y[2, 26]=+1.31
Y[3, 6]=+1.44 Y[3, 9]=+0.14 Y[3, 23]=+0.45 Y[3, 27]=+1.91
Y[4, 7]=+1.95 Y[4, 10]=+1.19 Y[4, 17]=+0.42 Y[4, 28]=+0.69
Y[5, 1]=+1.47 Y[5, 11]=+0.19 Y[5, 18]=+0.78 Y[5, 29]=+1.04
Y[6, 2]=+0.52 Y[6, 12]=+1.56 Y[6, 19]=+1.54 Y[6, 30]=+1.39
Y[7, 3]=+0.83 Y[7, 13]=+0.16 Y[7, 20]=+0.84 Y[7, 31]=+0.83
Y[8, 0]=+0.22 Y[8, 12]=+1.86 Y[8, 23]=+0.45 Y[8, 25]=+2.08
Y[9, 4]=+2.38 Y[9, 15]=+0.05 Y[9, 17]=+0.42 Y[9, 24]=+0.94
Y[10, 5]=+0.71 Y[10, 14]=+0.94 Y[10, 20]=+0.84 Y[10, 30]=+1.39
Y[11, 6]=+1.44 Y[11, 11]=+0.19 Y[11, 16]=+1.01 Y[11, 28]=+0.69
Y[12, 7]=+1.95 Y[12, 13]=+0.16 Y[12, 21]=+1.44 Y[12, 27]=+1.91
Y[13, 1]=+1.47 Y[13, 9]=+0.14 Y[13, 19]=+1.54 Y[13, 31]=+0.83
Y[14, 2]=+0.52 Y[14, 8]=+0.08 Y[14, 18]=+0.78 Y[14, 26]=+1.31
Y[15, 3]=+0.83 Y[15, 10]+1.19 Y[15, 22]=+1.65 Y[15, 29]=+1.04
Y[1.6, 0]=+0.22 Y[16, 13]=+0.16 Y[16, 17]=+0.42 Y[16, 26]=+1.31
Y[17, 4]=+2.38 Y[17, 11]=+0.19 Y[17, 23]=+0.45 Y[17, 30]=+1.39
Y[18, 5]=+0.71 Y[18, 9]=+0.14 Y[18, 18]=+0.78 Y[18, 24]=+0.94
Y[19, 6]=+1.44 Y[19, 15]=+0.05 Y[19, 21]=+1.44 Y[19, 31]=+0.83
Y[20, 7]=+1.95 Y[20, 12]=+1.86 Y[20, 16]=+1.01 Y[20, 29]=+1.04
Y[21, 1]=+1.47 Y[21, 14]=+0.94 Y[21, 22]=+1.65 Y[21, 28]=+0.69
Y[22, 2]=+0.52 Y[22, 10]=+1.19 Y[22, 20]=+0.84 Y[22, 25]=+2.08
Y[23, 3]=+0.83 Y[23, 8]=+0.08 Y[23, 19]=+1.54 Y[23, 27]=+1.91

At the first iteration, the check sums are computed, and the minimum parity check reliabilities, $Y_{mn-min}$, are determined as, check sums, $S_{mn}$:
S[0, 0]=0 S[0, 8]=0 S[0, 16]=0 S[0, 24]=0
S[1, 4]=0 S[1, 14]=0 S[1, 21]=0 S[1, 25]=0
S[2, 5]=1 S[2, 15]=1 S[2, 22]=1 S[2, 26]=1
S[3, 6]=0 S[3, 9]=0 S[3, 23]=0 S[3, 27]=0
S[4, 7]=1 S[4, 10]=1 S[4, 17]=1 S[4, 28]=1
S[5, 1]=0 S[5, 11]=0 S[5, 18]=0 S[5, 29]=0
S[6, 2]=0 S[6, 12]=0 S[6, 19]=0 S[6, 30]=0
S[7, 3]=0 S[7, 13]=0 S[7, 20]=0 S[7, 31]=0
S[8, 0]=1 S[8, 12]=1 S[8, 23]=1 S[8, 25]=1
S[9, 4]=0 S[9, 15]=0 S[9, 17]=0 S[9, 24]=0
S[10, 5]=1 S[10, 14]=1 S[10, 20]=1 S[10, 30]=1
S[11, 6]=1 S[11, 11]=1 S[11, 16]=1 S[11, 28]=1
S[12, 7]=0 S[12, 13]=0 S[12, 21]=0 S[12, 27]=0
S[13, 1]=0 S[13, 9]=0 S[13, 19]=0 S[13, 31]=0
S[14, 2]=1 S[14, 8]=1 S[14, 18]=1 S[14, 26]=1
S[15, 3]=0 S[15, 10]=0 S[15, 22]=0 S[15, 29]=0
S[16, 0]=1 S[16, 13]=1 S[16, 17]=1 S[16, 26]=1
S[17, 4]=0 S[17, 11]=0 S[17, 23]=0 S[17, 30]=0
S[18, 5]=1 S[18, 9]=1 S[18, 18]=1 S[18, 24]=1
S[19, 6]=0 S[19, 15]=0 S[19, 21]=0 S[19, 31]=0
S[20, 7]=0 S[20, 12]=0 S[20, 16]=0 S[20, 29]=0
S[21, 1]=1 S[21, 14]=1 S[21, 22]=1 S[21, 28]=1
S[22, 2]=0 S[22, 10]=0 S[22, 20]=0 S[22, 25]=0
S[23, 3]=1 S[23, 8]=1 S[23, 19]=1 S[23, 27]=1

$Y_{mn-min}$:
Y[0, 0]min=+0.08 Y[0, 8]min=+0.22 Y[0, 16]min=+0.08 Y[0, 24]min=+0.08
Y[1, 4]min=+0.94 Y[1, 14]min=+1.44 Y[1, 21]min=+0.94 Y[1, 25]min=+0.94
Y[2, 5]min=+0.05 Y[2, 15]min=+0.71 Y[2, 22]min=+0.05 Y[2, 26]min=+0.05
Y[3, 6]min=+0.14 Y[3, 9]min=+0.45 Y[3, 23]min=+0.14 Y[3, 27]min=+0.14
Y[4, 7]min=+0.42 Y[4, 10]min=+0.42 Y[4, 17]min=+0.69 Y[4, 28]min=+0.42
Y[5, 1]min=+0.19 Y[5, 11]min=+0.78 Y[5, 18]min=+0.19 Y[5, 29]min=+0.19
Y[6, 2]min=+1.39 Y[6, 12]min=+0.52 Y[6, 19]min=+0.52 Y[6, 30]min=+0.52
Y[7, 3]min=+0.16 Y[7, 13]min=+0.83 Y[7, 20]min=+0.16 Y[7, 31]min=+0.16
Y[8, 0]min=+0.45 Y[8, 12]min=+0.22 Y[8, 23]min=+0.22 Y[8, 25]min=+0.22
Y[9, 4]min=+0.05 Y[9, 15]min=+0.42 Y[9, 17]min=+0.05 Y[9, 24]min=+0.05
Y[10, 5]min=+0.84 Y[10, 14]min=+0.71 Y[10, 20]min=+0.71 Y[10, 30]min=+0.71
Y[11, 6]min=+0.19 Y[11, 11]min=+0.69 Y[11, 16]min=+0.19 Y[11, 28]min=+0.19
Y[12, 7]min=+0.16 Y[12, 13]min=+1.44 Y[12, 21]min=+0.16 Y[12, 27]min=+0.16
Y[13, 1]min=+0.14 Y[13, 9]min=+0.83 Y[13, 19]min=+0.14 Y[13, 31]min=+0.14
Y[14, 2]min=+0.08 Y[14, 8]min=+0.52 Y[14, 18]min=+0.08 Y[14, 26]min=+0.08
Y[15, 3]min=+1.04 Y[15, 10]min=+0.83 Y[15, 22]min=+0.83 Y[15, 29]min=+0.83
Y[16, 0]min=+0.16 Y[16, 13]min=+0.22 Y[16, 17]min=+0.16 Y[16, 26]min=+0.16
Y[17, 4]min=+0.19 Y[17, 11]min=+0.45 Y[17, 23]min=+0.19 Y[17, 30]min=+0.19
Y[18, 5]min=+0.14 Y[18, 9]min=+0.71 Y[18, 18]min=+0.14 Y[18, 24]min=+0.14
Y[19, 6]min=+0.05 Y[19, 15]min=+0.83 Y[19, 21]min=+0.05 Y[19, 31]min=+0.05
Y[20, 7]min=+1.01 Y[20, 12]min=+1.01 Y[20, 16]min=+1.04 Y[20, 29]min=+1.01
Y[21, 1]min=+0.69 Y[21, 14]min=+0.69 Y[21, 22]min=+0.69 Y[21, 28]min=+0.94
Y[22, 2]min=+0.84 Y[22, 10]min=+0.52 Y[22, 20]min=+0.52 Y[22, 25]min=+0.52
Y[23, 3]min=+0.08 Y[23, 8]min=+0.83 Y[23, 19]min=+0.08 Y[23, 27]min=+0.08

The threshold is calculated by first computing the updated bit reliabilities (comparison bit reliabilities), $Z_n$, as $Z_n$:
−0.30 +1.10 +2.67 +1.94 +3.56 −0.32 +1.45 +2.70
−1.04 +0.71 +2.12 +0.72 +3.17 +2.20 +0.98 +0.59
+1.95 −0.37 +0.74 +2.12 +0.80 +2.59 +1.73 +0.55
+0.94 +3.32 +1.02 +2.12 −0.86 +3.06 +1.38 +1.18

From these values of $Z_n$, the threshold is determined to be equal to −1.04. The comparison reliabilities, $Z_{mn}$, are formed and the parity check reliabilities, $Y_{mn}$, and associated hard decisions, $X_{mn}$, are updated as $Z_{mn}$:

Z[0, 0]=−0.38 Z[0, 8]=−1.26 Z[0, 16]=+1.86 Z[0, 24]=+0.86

Z[1, 4]=+2.62 Z[1, 14]=−0.46 Z[1, 21]=+1.65 Z[1, 25]=+2.38

Z[2, 5]=−0.27 Z[2, 15]=+1.30 Z[2, 22]=+1.78 Z[2, 26]=+1.08

Z[3, 6]=+1.31 Z[3, 9]+0.25 Z[3, 23]=+0.41 Z[3, 27]=+1.98

Z[4, 7]=+3.12 Z[4, 10]=+2.54 Z[4, 17]=+0.32 Z[4, 28]=−0.44

Z[5, 1]=+0.92 Z[5, 11]=−0.05 Z[5, 18]=+0.55 Z[5, 29]=+2.88

Z[6, 2]=+1.27 Z[6, 12]=+2.65 Z[6, 19]=+1.60 Z[6, 30]=+0.87

Z[7, 3]=+1.78 Z[7, 13]=+1.37 Z[7, 20]=+0.65 Z[7, 31]=+1.02

Z[8, 0]=+0.15 Z[8, 12]=+3.39 Z[8, 23]=+0.78 Z[8, 25]=+3.54

Z[9, 4]=+3.50 Z[9, 15]=+0.17 Z[9, 17]=−0.42 Z[9, 24]=+0.89

Z[10, 5]=+0.52 Z[10, 14]=+1.69 Z[10, 20]=+1.51 Z[10, 30]=+2.10

Z[11, 6]=+1.64 Z[11, 11]=+1.41 Z[11, 16]=+2.13 Z[11, 28]=−0.67

Z[12, 7]=+2.54 Z[12, 13]=+0.76 Z[12, 21]=+2.44 Z[12, 27]=+1.96

Z[13, 1]=+0.96 Z[13, 9]=−0.12 Z[13, 19]=+1.98 Z[13, 31]=+1.04

Z[14, 2]=+2.75 Z[14, 8]=−0.52 Z[14, 18]=+0.82 Z[14, 26]=+1.10

Z[15, 3]=+0.90 Z[15, 10]=+1.29 Z[15, 22]=+0.90 Z[15, 29]=+2.23

Z[16, 0]=−0.14 Z[16, 13]=+2.42 Z[16, 17]=−0.21 Z[16, 26]=+1.18

Z[17, 4]=+3.37 Z[17, 11]=+0.27 Z[17, 23]=+0.37 Z[17, 30]=+1.20

Z[18, 5]=−0.18 Z[18, 9]=+1.42 Z[18, 18]=+0.88 Z[18, 24]=+1.08

Z[19, 6]=+1.40 Z[19, 15]=−0.23 Z[19, 21]=+2.54 Z[19, 31]=+1.12

Z[20, 7]=+1.69 Z[20, 12]=+2.16 Z[20, 16]=+0.91 Z[20, 29]=+2.05

Z[21, 1]=+1.80 Z[21, 14]=+1.67 Z[21, 22]=+2.42 Z[21, 28]=+0.08

Z[22, 2]=+1.83 Z[22, 10]=+1.60 Z[22, 20]=+0.28 Z[22, 25]=+2.80

Z[23, 3]=+2.02 Z[23, 8]=−0.21 Z[23, 19]=+2.20 Z[23, 27]=+2.20

$Y_{mn}$:

Y[0, 0]=+0.00 Y[0, 8]=+1.26 Y[0, 16]=+1.86 Y[0, 24]=+0.86

Y[1, 4]=+2.62 Y[1, 14]=+0.00 Y[1, 21]=+1.65 Y[1, 25]=+2.38

Y[2, 5]=+0.00 Y[2, 15]=+1.30 Y[2, 22]=+1.78 Y[2, 26]=+1.08

Y[3, 6]=+1.31 Y[3, 9]=+0.25 Y[3, 23]=+0.41 Y[3, 27]=+1.98

Y[4, 7]=+3.12 Y[4, 10]=+2.54 Y[4, 17]=+0.32 Y[4, 28]=+0.00

Y[5, 1]=+0.92 Y[5, 11]=+0.00 Y[5, 18]=+0.55 Y[5, 29]=+2.88

Y[6, 2]=+1.27 Y[6, 12]=+2.65 Y[6, 19]=+1.60 Y[6, 30]=+0.87

Y[7, 3]=+1.78 Y[7, 13]=+1.37 Y[7, 20]=+0.65 Y[7, 31]=+1.02

Y[8, 0]=+0.15 Y[8, 12]=+3.39 Y[8, 23]=+0.78 Y[8, 25]=+3.54

Y[9, 4]=+3.50 Y[9, 15]=+0.17 Y[9, 17]=+0.00 Y[9, 24]=+0.89

Y[10, 5]=+0.52 Y[10, 14]=+1.69 Y[10, 20]=+1.51 Y[10, 30]=+2.10

Y[11, 6]=+1.64 Y[11, 11]=+1.41 Y[11, 16]=+2.13 Y[11, 28]=+0.00

Y[12, 7]=+2.54 Y[12, 13]=+0.76 Y[12, 21]=+2.44 Y[12, 27]=+1.96

Y[13, 1]=+0.96 Y[13, 9]=+0.00 Y[13, 19]=+1.98 Y[13, 31]=+1.04

Y[14, 2]=+2.75 Y[14, 8]=+0.00 Y[14, 18]=+0.82 Y[14, 26]=+1.10

Y[15, 3]=+0.90 Y[15, 10]=+1.29 Y[15, 22]=+0.90 Y[15, 29]=+2.23

Y[16, 0]=+0.00 Y[16, 13]=+2.42 Y[16, 17]=+0.00 Y[16, 26]=+1.18

Y[17, 4]=+3.37 Y[17, 11]=+0.27 Y[17, 23]=+0.37 Y[17, 30]=+1.20

Y[18, 5]=+0.00 Y[18, 9]=+1.42 Y[18, 18]=+0.88 Y[18, 24]=+1.08

Y[19, 6]=+1.40 Y[19, 15]=+0.00 Y[19, 21]=+2.54 Y[19, 31]=+1.12

Y[20, 7]=+1.69 Y[20, 12]=+2.16 Y[20, 16]=+0.91 Y[20, 29]=+2.05

Y[21, 1]=+1.80 Y[21, 14]=+1.67 Y[21, 22]=+2.42 Y[21, 28]=+0.08

Y[22, 2]=+1.83 Y[22, 10]=+1.60 Y[22, 20]=+0.28 Y[22, 25]=+2.80

Y[23, 3]=+2.02 Y[23, 8]=+0.00 Y[23, 19]=+2.20 Y[23, 27]=+2.20

$X_{mn}$:

X[0, 0]=1 X[0, 8]=0 X[0, 16]=1 X[0, 24]=1

X[1, 4]=0 X[1, 14]=1 X[1, 21]=1 X[1, 25]=0

X[2, 5]=1 X[2, 15]=1 X[2, 22]=1 X[2, 26]=0

X[3, 6]=1 X[3, 9]=0 X[3, 23]=0 X[3, 27]=1

X[4, 7]=0 X[4, 10]=1 X[4, 17]=0 X[4, 28]=0

X[5, 1]=1 X[5, 11]=1 X[5, 18]=1 X[5, 29]=1

X[6, 2]=1 X[6, 12]=0 X[6, 19]=0 X[6, 30]=1

X[7, 3]=1 X[7, 13]=0 X[7, 20]=0 X[7, 31]=1

X[8, 0]=1 X[8, 12]=0 X[8, 23]=0 X[8, 25]=0

X[9, 4]=0 X[9, 15]=1 X[9, 17]=0 X[9, 24]=1

X[10, 5]=1 X[10, 14]=1 X[10, 20]=0 X[10, 30]=1

X[11, 6]=1 X[11, 11]=1 X[11, 16]=1 X[11, 28]=1

X[12, 7]=0 X[12, 13]=0 X[12, 21]=1 X[12, 27]=1

X[13, 1]=1 X[13, 9]=0 X[13, 19]=0 X[13, 31]=1

X[14, 2]=1 X[14, 8]=1 X[14, 18]=1 X[14, 26]=0

X[15, 3]=1 X[15, 10]=1 X[15, 22]=1 X[15, 29]=1

X[16, 0]=1 X[16, 13]=0 X[16, 17]=0 X[16, 26]=0

X[17, 4]=0 X[17, 11]=1 X[17, 23]=0 X[17, 30]=1

X[18, 5]=1 X[18, 9]=0 X[18, 18]=1 X[18, 24]=1

X[19, 6]=1 X[19, 15]=1 X[19, 21]=1 X[19, 31]=1

X[20, 7]=0 X[20, 12]=0 X[20, 16]=1 X[20, 29]=1

X[21, 1]=1 Y[21, 14]=1 X[21, 22]=1 X[21, 28]=0

X[22, 2]=1 X[22, 10]=1 X[22, 20]=0 X[22, 25]=0

X[23, 3]=1 X[23, 8]=1 X[23, 19]=0 X[23, 27]=1

Then a test codeword is formed as reconstructed codeword $C=\{C_i\}$:

0111001000110011
1110011010011111

The test codeword C is such that $HC^T \neq 0$, and a second iteration is made. Iteration 2 begins with computing new check sums and new minimum parity check reliabilities, $Y_{mn-min}$, as, check sums, $S_{mn}$:
S[0, 0]=1 S[0, 8]=0 S[0, 16]=1 S[0, 24]=1
S[1, 4]=0 S[1, 14]=0 S[1, 21]=0 S[1, 25]=0
S[2, 5]=1 S[2, 15]=1 S[2, 22]=1 S[2, 26]=1
S[3, 6]=0 S[3, 9]=0 S[3, 23]=0 S[3, 27]=0
S[4, 7]=1 S[4, 10]=1 S[4, 17]=1 S[4, 28]=1
S[5, 1]=0 S[5, 11]=0 S[5, 18]=0 S[5, 29]=0
S[6, 2]=0 S[6, 12]=0 S[6, 19]=0 S[6, 30]=0
S[7, 3]=0 S[7, 13]=0 S[7, 20]=0 S[7, 31]=0
S[8, 0]=1 S[8, 12]=0 S[8, 23]=1 S[8, 25]=1
S[9, 4]=0 S[9, 15]=0 S[9, 17]=0 S[9, 24]=0
S[10, 5]=1 S[10, 14]=1 S[10, 20]=1 S[10, 30]=1
S[11, 6]=1 S[11, 11]=1 S[11, 16]=1 S[11, 28]=1
S[12, 7]=0 S[12, 13]=0 S[12, 21]=0 S[12, 27]=0
S[13, 1]=0 S[13, 9]=0 S[13, 19]=0 S[13, 31]=0
S[14, 2]=1 S[14, 8]=1 S[14, 18]=1 S[14, 26]=1
S[15, 3]=0 S[15, 10]=0 S[15, 22]=0 S[15, 29]=0
S[16, 0]=1 S[16, 13]=1 S[16, 17]=1 S[16, 26]=1
S[17, 4]=0 S[17, 11]=0 S[17, 23]=0 S[17, 30]=0
S[18, 5]=1 S[18, 9]=1 S[18, 18]=1 S[18, 24]=1
S[19, 6]=0 S[19, 15]=0 S[19, 21]=0 S[19, 31]=0
S[20, 7]=0 S[20, 12]=0 S[20, 16]=0 S[20, 29]=0
S[21, 1]=1 S[21, 14]=1 S[21, 22]=1 S[21, 28]=1
S[22, 2]=0 S[22, 10]=0 S[22, 20]=0 S[22, 25]=0
S[23, 3]=1 S[23, 8]=1 S[23, 19]=1 S[23, 27]=1

$Y_{mn-min}$:
Y[0, 0]min=+0.86 Y[0, 8]min=+0.00 Y[0, 16]min=+0.00 Y[0, 24]min=+0.00
Y[1, 4]min=+0.00 Y[1, 14]min=+1.65 Y[1, 21]min=+0.00 Y[1, 25]min=+0.00
Y[2, 5]min=+1.08 Y[2, 15]min=+0.00 Y[2, 22]min=+0.00 Y[2, 26]min=+0.00
Y[3, 6]min=+0.25 Y[3, 9]min=+0.41 Y[3, 23]min=+0.25 Y[3, 27]min=+0.25
Y[4, 7]min=+0.00 Y[4, 10]min=+0.00 Y[4, 17]min=+0.00 Y[4, 28]min=+0.32
Y[5, 1]min=+0.00 Y[5, 11]min=+0.55 Y[5, 18]min=+0.00 Y[5, 29]min=+0.00
Y[6, 2]min=+0.87 Y[6, 12]min=+0.87 Y[6, 19]min=+0.87 Y[6, 30]min=+1.27
Y[7, 3]min=+0.65 Y[7, 13]min=+0.65 Y[7, 20]min=+1.02 Y[7, 31]min=+0.65
Y[8, 0]min=+0.78 Y[8, 12]min=+0.15 Y[8, 23]min=+0.15 Y[8, 25]min=+0.15
Y[9, 4]min=+0.00 Y[9, 15]min=+0.00 Y[9, 17]min=+0.17 Y[9, 24]min=+0.00
Y[10, 5]min=+1.51 Y[10, 14]min=+0.52 Y[10, 20]min=+0.52 Y[10, 30]min=+0.52
Y[11, 6]min=+0.00 Y[11, 11]min=+0.00 Y[11, 16]min=+0.00 Y[11, 28]min=+1.41
Y[12, 7]min=+0.76 Y[12, 13]min=+1.96 Y[12, 21]min=+0.76 Y[12, 27]min=+0.76
Y[13, 1]min=+0.00 Y[13, 9]min=+0.96 Y[13, 19]min=+0.00 Y[13, 31]min=+0.00
Y[14, 2]min=+0.00 Y[14, 8]min=+0.82 Y[14, 18]min=+0.00 Y[14, 26]min=+0.00
Y[15, 3]min=+0.90 Y[15, 10]min=+0.90 Y[15, 22]min=+0.90 Y[15, 29]min=+0.90
Y[16, 0]min=+0.00 Y[16, 13]min=+0.00 Y[16, 17]min=+0.00 Y[16, 26]min=+0.00
Y[17, 4]min=+0.27 Y[17, 11]min=+0.37 Y[17, 23]min=+0.27 Y[17, 30]min=+0.27
Y[18, 5]min=+0.88 Y[18, 9]min=+0.00 Y[18, 18]min=+0.00 Y[18, 24]min=+0.00
Y[19, 6]min=+0.00 Y[19, 15]min=+1.12 Y[19, 21]min=+0.00 Y[19, 31]min=+0.00
Y[20, 7]min=+0.91 Y[20, 12]min=+0.91 Y[20, 16]min=+1.69 Y[20, 29]min=+0.91
Y[21, 1]min=+0.08 Y[21, 14]min=+0.08 Y[21, 22]min=+0.08 Y[21, 28]min=+1.67
Y[22, 2]min=+0.28 Y[22, 10]min=+0.28 Y[22, 20]min=+1.60 Y[22, 25]min=+0.28
Y[23, 3]min=+0.00 Y[23, 8]min=+2.02 Y[23, 19]min=+0.00 Y[23, 27]min=+0.00

The threshold has been assigned for iterations 1, 2, and 3 as the minimum value of the updated bit reliabilities (comparison bit reliabilities), $Z_n$, calculated in the first iteration. Thus, in this iteration the threshold is set at −1.04 as in the first iteration. The updated bit reliabilities (comparison bit reliabilities), $Z_n$, for the second iteration are determined to be:

$Z_n$:
−1.41 +1.39 +1.67 +2.38 +2.65 −2.76 +1.70 +3.62
−2.76 +1.52 +2.37 +1.11 +3.48 +2.77 +1.99 +1.18
+2.70 +0.59 +0.78 +2.41 +2.94 +2.20 +2.46 +0.83
+0.94 +2.21 +−1.31 +2.92 −2.72 +2.85 +2.42 +1.47

The second iteration comparison reliabilities, $Z_{mn}$, are formed and the second iteration parity check reliabilities, $Y_{mn}$, and associated hard decisions, $X_{mn}$, are updated as $Z_{mn}$:
Z[0, 0]=−0.38 Z[0, 8]=−1.26 Z[0, 16]=+1.86 Z[0, 24]=+0.86
Z[0, 0]=−0.55 Z[0, 8]=−2.76 Z[0, 16]=+2.70 Z[0, 24]=+0.94
Z[1, 4]=+2.65 Z[1, 14]+0.34 Z[1, 21]+2.20 Z[1, 25]+2.21
Z[2, 5]=−1.68 Z[2, 15]+1.18 Z[2, 22]+2.46 Z[2, 26]+1.31
Z[3, 6]=+1.44 Z[3, 9]=+1.10 Z[3, 23]=+0.57 Z[3, 27]=+2.67
Z[4, 7]=+3.62 Z[4, 10]=+2.37 Z[4, 17]=+0.59 Z[4, 28]=−2.40
Z[5, 1]=+1.39 Z[5, 11]=+0.55 Z[5, 18]=+0.78 Z[5, 29]=+2.85
Z[6, 2]=+0.80 Z[6, 12]=+2.62 Z[6, 19]=+1.54 Z[6, 30]=+1.15
Z[7, 3]=+1.73 Z[7, 13]=+2.12 Z[7, 20]=+1.92 Z[7, 31]=+0.83
Z[8, 0]=−0.63 Z[8, 12]=+3.64 Z[8, 23]=+0.98 Z[8, 25]=+2.37
Z[9, 4]=+2.65 Z[9, 15]=+1.18 Z[9, 17]+0.42 Z[9, 24]=+0.94
Z[10, 5]=−1.24 Z[10, 14]=+2.51 Z[10, 20]=+3.46 Z[10, 30]=+2.94
Z[11, 6]=+1.70 Z[11, 11]=+1.11 Z[14, 16]=+2.70 Z[11, 28]=−1.30
Z[12, 7]=+2.86 Z[12, 13]=+0.80 Z[12, 21]=+1.44 Z[12, 27]=+2.16
Z[13, 1]=+1.39 Z[13, 9]=+0.55 Z[13, 19]=+2.41 Z[13, 31]=+1.47
Z[14, 2]=+1.67 Z[14, 8]=−1.94 Z[14, 18]=+0.78 Z[14, 26]=+1.31
Z[15, 3]=+1.47 Z[15, 10]=+1.48 Z[15, 22]=+1.56 Z[15, 29]=+1.95
Z[16, 0]=−1.41 Z[16, 13]=+2.77 Z[16, 17]=+0.59 Z[16, 26]=+1.31
Z[17, 4]=+2.38 Z[17, 11]=+0.74 Z[17, 23]=+0.55 Z[17, 30]=+2.15
Z[18, 5]=−1.88 Z[18, 9]=+1.52 Z[18, 18]=+0.78 Z[18, 24]=+0.94
Z[19, 6]=+1.70 Z[19, 15]=+0.05 Z[19, 21]=+2.20 Z[19, 31]=+1.47

Z[20, 7]=+2.71 Z[20, 12]=+2.58 Z[20, 16]=+1.01 Z[20, 29]=+1.94
Z[21, 1]=+1.47 Z[21, 14]=+2.08 Z[21, 22]=+2.55 Z[21, 28]=−1.04
Z[22, 2]=+1.38 Z[22, 10]=+2.09 Z[22, 20]=+1.34 Z[22, 25]=+1.93
Z[23, 3]=+2.38 Z[23, 8]=−0.74 Z[23, 19]=+2.41 Z[23, 27]=+2.92

$Y_{mn}$:
Y[0, 0]=+0.00 Y[0, 8]=+2.76 Y[0, 16]=+2.70 Y[0, 24]=+0.94
Y[1, 4]=+2.65 Y[1, 14]=+0.34 Y[1, 21]=+2.20 Y[1, 25]=+2.21
Y[2, 5]=+1.68 Y[2, 15]=+1.18 Y[2, 22]=+2.46 Y[2, 26]=+1.31
Y[3, 6]=+1.44 Y[3, 9]=+1.10 Y[3, 23]=+0.57 Y[3, 27]=+2.67
Y[4, 7]=+3.62 Y[4, 10]=+2.37 Y[4, 17]=+0.59 Y[4, 28]=+2.40
Y[5, 1]=+1.39 Y[5, 11]=+0.55 Y[5, 18]=+0.78 Y[5, 29]=+2.85
Y[6, 2]=+0.80 Y[6, 12]=+2.62 Y[6, 19]=+1.54 Y[6, 30]=+1.15
Y[7, 3]=+1.73 Y[7, 13]=+2.12 Y[7, 20]=+1.92 Y[7, 31]=+0.83
Y[8, 0]=+0.00 Y[8, 12]=+3.64 Y[8, 23]=+0.98 Y[8, 25]=+2.37
Y[9, 4]=+2.65 Y[9, 15]=+−1.18 Y[9, 17]=+0.42 Y[9, 24]=+0.94
Y[10, 5]=+1.24 Y[10, 14]=+2.51 Y[10, 20]=+3.46 Y[10, 30]=+2.94
Y[11, 6]=+1.70 Y[11, 11]=+1.11 Y[11, 16]=+2.70 Y[11, 28]=+1.30
Y[12, 7]=+2.86 Y[12, 13]=+0.80 Y[12, 21]=+1.44 Y[12, 27]=+2.16
Y[13, 1]=+1.39 Y[13, 9]=+0.55 Y[13, 19]=+2.41 Y[13, 31]=+1.47
Y[14, 2]=+1.67 Y[14, 8]=+1.94 Y[14, 18]=+0.78 Y[14, 26]=+1.31
Y[15, 3]=+1.47 Y[15, 10]=+1.48 Y[15, 22]=+1.56 Y[15, 29]=+1.95
Y[16, 0]=+1.41 Y[16, 13]=+2.77 Y[16, 17]=+0.59 Y[16, 26]=+1.31
Y[17, 4]=+2.38 Y[17, 11]=+0.74 Y[17, 23]=+0.55 Y[17, 30]=+2.15
Y[18, 5]=+1.88 Y[18, 9]=+1.52 Y[18, 18]=+0.78 Y[18, 24]=+0.94
Y[19, 6]=+1.70 Y[19, 15]=+0.05 Y[19, 21]=+2.20 Y[19, 31]=+1.47
Y[20, 7]=+2.71 Y[20, 12]=+2.58 Y[20, 16]=+1.01 Y[20, 29]=+1.94
Y[21, 1]=+1.47 Y[21, 14]=+2.08 Y[21, 22]=+2.55 Y[21, 28]=+1.04
Y[22, 2]=+1.38 Y[22, 10]=+2.09 Y[22, 20]=+1.34 Y[22, 25]=+1.93
Y[23, 3]=+2.38 Y[23, 8]=+0.00 Y[23, 19]=+2.41 Y[23, 27]=+2.92

$X_{mn}$:
X[0, 0]=1 X[0, 8]=0 X[0, 16]=1 X[0, 24]=1
X[1, 4]=0 X[1, 14]=1 X[1, 21]=1 X[1, 25]=0
X[2, 5]=0 X[2, 15]=1 X[2, 22]=1 X[2, 26]=0
X[3, 6]=1 X[3, 9]=0 X[3, 23]=0 X[3, 27]=1
X[4, 7]=0 X[4, 10]=1 X[4, 17]=0 X[4, 28]=1
X[5, 1]=1 X[5, 11]=1 X[5, 18]=1 X[5, 29]=1
X[6, 2]=1 X[6, 12]=0 X[6, 19]=1 X[6, 30]=1
X[7, 3]=1 X[7, 13]=0 X[7, 20]=1 X[7, 31]=1
X[8, 0]=1 X[8, 12]=0 X[8, 23]=0 X[8, 25]=0
X[9, 4]=0 X[9, 15]=1 X[9, 17]=0 X[9, 24]=1
X[10, 5]=0 X[10, 14]=1 X[10, 20]=0 X[10, 30]=1
X[11, 6]=0 X[11, 11]=1 X[11, 16]=1 X[11, 28]=1
X[12, 7]=0 X[12, 13]=0 X[12, 21]=1 X[12, 27]=1
X[13, 1]=1 X[13, 9]=0 X[13, 19]=0 X[13, 31]=1
X[14, 2]=1 X[14, 8]=0 X[14, 18]=1 X[14, 26]=0
X[15, 3]=1 X[15, 10]=1 X[15, 22]=1 X[15, 29]=1
X[16, 0]=0 X[16, 13]=0 X[16, 17]=0 X[16, 26]=0
X[17, 4]=0 X[17, 11]=1 X[17, 23]=0 X[17, 30]=1
X[18, 5]=0 X[18, 9]=0 X[18, 18]=11 X[18, 24]=1
X[19, 6]=1 X[19, 15]=1 X[19, 21]=1 X[19, 31]=1
X[20, 7]=0 X[20, 12]=0 X[20, 16]=11 X[20, 29]=1
X[21, 1]=1 X[21, 14]=1 X[21, 22]=1 X[21, 28]=1
X[22, 2]=1 X[22, 10]=1 X[22, 20]=0 X[22, 25]=0
X[23, 3]=1 X[23, 8]=1 X[23, 19]=0 X[23, 27]=1

Then the test codeword is formed as reconstructed codeword C={$C_i$}
0111001000110011
1010011010011111

The test codeword C is such that $HC^T=0$, and the decoding is ended with the decoding considered as successful. Iterations 3-5 are not needed in this example, and the iterations are terminated. Though a second value was selected and scheduled for use in iterations 4 and 5, it was not needed. This example of an implementation of an embodiment for a multiple threshold decoding scheme and is not intended as a limitation to the various embodiments of the present invention.

Various embodiments for decoding a received codeword using a multi-valued threshold can be applied to any low density parity check code. In such embodiments, as the weight of the parity check weight is decreased, the decoding quality is increased. These embodiments may be applied in a method providing small complexity to the decoding scheme. Various combinations for providing the multiple threshold values during the iteration process can be used depending on the allowable complexity desired for a given application. Additional reduction in complexity is provided using embodiments of the multiple-threshold decoding method since these embodiments can operate in hardware implementations without floating point numbers, which eliminates complexity and expense. Embodiments for a multiple-threshold decoding scheme allows for pipeline and/or parallel processing in hardware implementations since the use of a multi-valued threshold can provide a fast decoding scheme.

Embodiments for a multiple-threshold decoding scheme may be adapted to be used in any system operating with a communication channel. The communication channel may be part of a land based communication network or a wireless communication network. Indeed, embodiments of the present invention may well be implemented as part of any wireless system using multi-carrier wireless communication channels (e.g., orthogonal frequency-division multiplexing (OFDM), discrete multi-tone modulation (DMT), etc.), such as may be used within, without limitation, a wireless personal area network (WPAN), a wireless local area network (WLAN), a wireless metropolitan area network (WMAN), a wireless wide area network (WWAN), a cellular network, a third generation (3G) network, a fourth generation (4G) network, a universal mobile telephone system (UMTS), and similar communication systems.

In various embodiments, data is provided by decoding codewords received from a communication channel. Decoding schemes employed may use thresholds in the decoding process. Thresholds in an iterative decoding process may be viewed as criteria against which a comparison may be made to control subsequent activities in the process. An embodiment includes a decoder having a multi-threshold decision scheme. By multi-threshold decision scheme, it is meant that a threshold value is changed to a computed value or a predefined value during one or more decoding iterations. In a multi-threshold decoder, the threshold may have different values during different iterative segments of the decoding process. Embodiments for decoding schemes and apparatus adapted to such schemes include application of a multi-threshold decoder using an adaptive threshold selection and a fixed threshold selection. In an embodiment, during the first iteration a maximum threshold value (by absolute value) is used and in following iterations, a change of threshold is applied in which the threshold decreases. Changing the threshold values allows the use of a high threshold value during the first iteration leading to an absence, or reduction, of error propagation. Thus, if the decoder corrects even a small number of errors, the decoding at following iterations becomes significantly easier. Use of an embodiment of the multi-threshold decoding scheme may lead to a decrease in the number of iterations made during decoding.

In an adaptive threshold selection, a threshold may be computed during each decoder iteration or may be computed in the first decoder iteration and then used in subsequent decoding iterations. In an adaptive threshold approach, the decoder needs no additional information about the parameters of the communication channel, such as noise dispersion, in which the signal carrying the codeword propagates. Though an adaptive threshold selection scheme may operate independent of channel parameter characterization, decoders operating with an adaptive threshold selection use additional time during decoding to calculate thresholds, whether the decoder is software based or hardware based. Further, in a hardware implementation, a large number of elementary logic blocks may be used to perform the decoding.

In an embodiment for decoding using a fixed thresholds selection scheme, a decoder uses predefined thresholds. Usage of fixed thresholds decreases decoder complexity. The thresholds for a multi-threshold decoder are not constant and depend on a variety of parameters, such as channel signal-to-noise ratio, SNR, the code construction for generating the codeword, and the code length. Fixed values for a threshold may be selected separately for each codeword construction and code length. In an embodiment, the codeword may be realized as a low density parity check (LDPC) codeword.

In an embodiment, the functioning of a multi-threshold decoder in an additive white Gaussian noise (AWGN) channel is simulated for some channel parameter. An embodiment of a multi-threshold decoder as illustrated in FIG. 1 or 6 may be used in a simulation to determine values for the threshold. A thresholds table is formed having one or more values for different values of the channel parameter. In an embodiment, information about the channel parameter is provided by a channel estimation unit configured in an active transmission architecture. The channel estimation unit and the multi-threshold decoder may be arranged to jointly decode codewords in a signal. In an embodiment, the channel estimation unit gives information about the channel parameter to the decoder, and the decoder selects a plurality of thresholds for the given channel parameter from the predefined thresholds table. Usage information about channel parameter values generates additional information to the decoder, which increases the decoder performance. Further, usage of a predefined thresholds table allows for the quick selection of threshold values based on channel conditions, which increases decoding speed without quality loss compared to an adaptive thresholds selection scheme.

Figure 7:
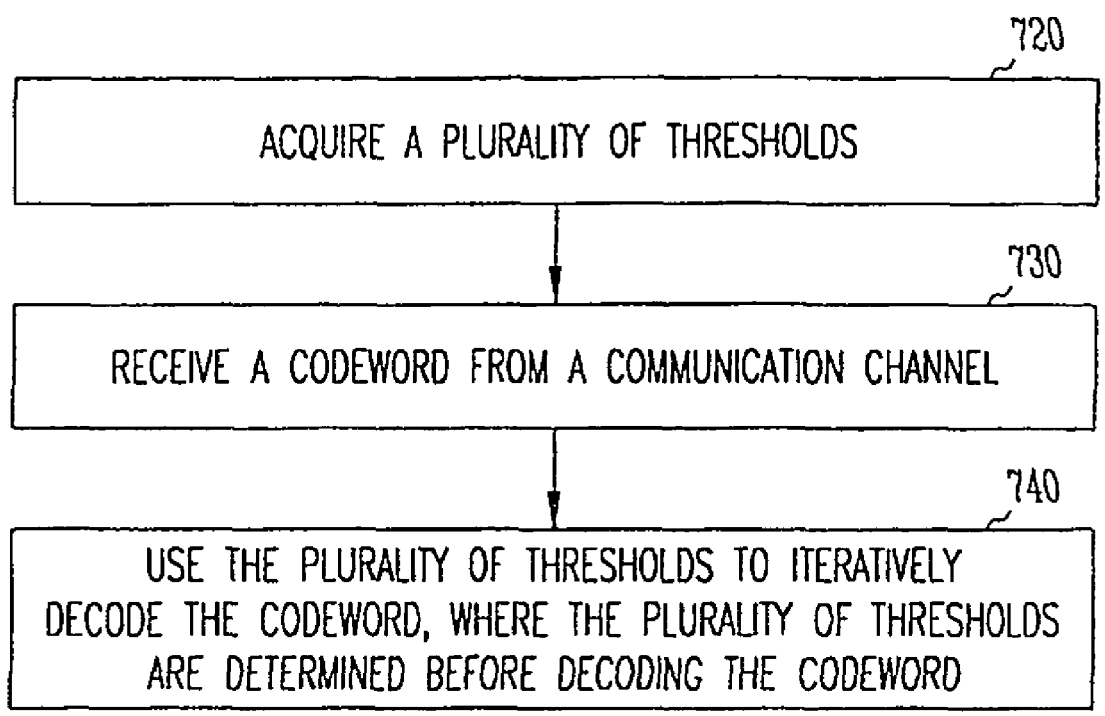
FIG. 7 shows a flow diagram of an embodiment of a method for iteratively decoding information received from a communication channel using a set of fixed thresholds.

FIG. 7 shows a flow diagram of an embodiment of a method for iteratively decoding data received from a communication channel using a set of fixed thresholds. At 720, a plurality of thresholds is acquired. The plurality of thresholds may be acquired by accessing a table or other form of database in which these thresholds may be stored. Such tables or databases may be reside in the apparatus or system performing the decoding or may reside external to such an apparatus or system.

The plurality of thresholds may be realized as a threshold table in various embodiments. The following table is a non-limiting example of entries for a few codes and SNR values that may populate a threshold table:

| SNR | EG(255, 175) | Eric(2000, 1600) | Infenion(2400, 1800) | PEG(504, 252) | RS(2048, 1649) | Vand(1000, 757) |
|---|---|---|---|---|---|---|
| 2.00 | −1.703209 | −1.013369 | −1.473104 | −2.696182 | −0.830832 | −0.918977 |
| 2.25 | −1.797118 | −1.049672 | −1.539172 | −2.738346 | −0.869202 | −0.960916 |
| 2.50 | −1.919731 | −1.096213 | −1.598608 | −2.873956 | −0.896573 | −0.987151 |
| 2.75 | −2.035528 | −1.121660 | −1.686542 | −2.973981 | −0.951840 | −1.025731 |
| 3.00 | −2.147337 | −1.170183 | −1.754481 | −3.105872 | −1.003469 | −1.069663 |
| 3.25 | −2.283049 | −1.209998 | −1.818938 | −3.250985 | −1.069735 | −1.123508 |
| 3.50 | −2.440478 | −1.250196 | −1.913103 | −3.353540 | −1.150105 | −1.180198 |
| 3.75 | −2.623968 | −1.297393 | −2.004750 | −3.489512 | −1.237858 | −1.229442 |
| 4.00 | −2.804447 | −1.352606 | −2.083417 | −3.634091 | −1.330557 | −1.304540 |
| 4.25 | −2.999468 | −1.397764 | −2.167832 | −3.753314 | −1.433518 | −1.354703 |
| 4.50 | −3.205640 | −1.441435 |  | −3.866233 | −1.546978 | −1.419868 |

In this table, the numbers in parenthesis represent the code length and length, respectively. The following provides a list of the codes in the above table:

EG(255,175) Construction: LDPC codes based on Euclidian geometries, Length: 255, Message length: 175 (See, Y. Kou, S. Lin, and Marc P. C. Fossorier. Low-Density Pality-Check Codes Based on Finite Geometries: A Rediscovery and New Results, IEEE Transactions on Information Theory, 47(7), November 2001.)

Eric(2000,1600) Construction:
LDPC code from Bo Xia construction, Length: 2000, Message length: 1600 (See, Eric Jacobsen, Intel LDPC Code Technical Description, Oct. 27, 2003, V0.01)

Infenion(2400,1800) Construction: LDPC code, Infenion construction, Length: 2400, Message length: 1800 (A technical presentation by Infenion Technologies.)

PEG(504,252) Construction: LDPC code obtained by Progressive Edge Growth algorithm, Length: 504, Message length: 252 (See, X.-Y. Hu, E. Eleftheriou, D.-M. Arnold. Regular and Irregular Progressive Edge-Growth Tanner Graphs. IBM Research, Zurich Research Laboratory, 2003.)

RS(2048,1649) Construction: LDPC code from Reed-Solomon codes with 2 information symbols, Length: 2048, Message length: 1649 (See, I. Djurdjevic, J. Xu, K. Abdel-GhaRar, and S. Lin, A Class of Low-Density Parity-Check Codes Constructed Based on Reed-Solomon Codes With Two Information Symbols. IEEE Communications Letters, 7(7), July 2003.)

Vanid(1000, 757) Construction: LDPC code based on Vandermondematrix and cyclic permutation blocks, Length: 1000, Message length: 757. (See, E. Krouk et al. 10G Ethernet. Technical report, Intel Nizhny Novgorod, Lab, March 2004).

These LPDC code constructions are provided as examples, where such type of code constructions can be understood by those skilled in the art.

In an embodiment, for each value of SNR and each code construction, the threshold has one value, typically applied to at least the first iteration of a decoding scheme, where at least one additional fixed value of the threshold is provided in the decoding scheme. The additional fixed value may be zero for the second iteration and subsequent iterations of the decoding scheme. Alternatively, a threshold table may include a number of entries for a channel parameter, and for each entry for the channel parameter, the threshold parameter may include a plurality of values of the threshold, where an indicator or indicators are provided that signify during which iteration a particular threshold value is used. Associated with the threshold table may be a value for the maximum number of iterations to be used before determining that the codeword is not to be decoded. Such a table may also include a number of different channel parameters, where the values for each channel parameter have its associated plurality of threshold values.

The thresholds for a multi-threshold decoder are not constant, but depend on various parameters such as the channel signal to noise ratio (SNR), the code construction, and the code length. For each codeword construction and code length, a separate set of fixed thresholds may be selected. Each type of code implemented may have its own set of fixed thresholds. In an embodiment, the codeword may be realized as a low density parity check (LDPC) codeword. In an embodiment, the set of fixed thresholds may be determined by simulating a multi-threshold decoder. In an embodiment, the operation of a multi-threshold decoder is simulated with respect to a channel parameter. The channel parameter may be a SNR. In an embodiment, the channel parameter may be a noise dispersion. The set of channel parameters may be a set of standard deviations correlated to channel parameters. Other statistical variations in a simulated channel may be implemented to determine thresholds for the decoding process.

In an embodiment, the operation a multi-threshold decoder to an AWGN channel is simulated with respect to a selected channel parameter. In an embodiment, for some SNR, the simulation provides multiple thresholds to perform the decoding. An average value of the thresholds used in the simulation decoding may be calculated. A threshold table may be formed having entries for different values of SNRs or different noise dispersions. The threshold table is not limited to different values of SNRs or noise dispersions, but may be based on other channel parameters. The threshold table may contain multiple values of a decoding threshold for each value of the channel parameter. Each of the multiple values of the threshold may be assigned to specific iterations of the decoding scheme to decode the codeword. The subsequent use of the threshold table to iteratively decode a codeword received in the communication channel provides a set of fixed values for the multiple thresholds to a multi-threshold decoder.

Determining the set of multiple thresholds for each value of a channel parameter is not limited to a simulation process. Other processes may be implemented to determine the set of multi-valued thresholds.

At 730, a codeword is received from a communication channel. The codeword may be embedded in a signal propagating in the communication channel. The codeword may represent information that is transmitted in a communication channel, where the information is encoded or converted to codewords to be transmitted in the communication channel. The use of codewords to transmit information allows for the application of error correction methods to the transmission of the information. The communication channel may be an integral part of a larger communication network or a channel in an apparatus that implements high speed data transmission.

At 740, the plurality of thresholds is used to iteratively decode the codeword. Decoding of codewords may be implemented using multiple values for a threshold in the decoding scheme in which the multiple values are selected from the plurality of thresholds. These thresholds have fixed values, which have been determined before decoding the codeword. In an embodiment, the thresholds are selected prior to receiving the codeword. In an embodiment, the decoder may select the plurality of thresholds by selecting one value of a threshold to be used in one or more iterations with another value of the threshold fixed by the decoding scheme.

In an embodiment, a decoding scheme, having features illustrated in FIG. 7, may be implemented by modifying features of the decoding scheme illustrated in FIGS. 1 and/or 6. Such modification includes the use of predetermined values of the threshold rather than calculating values of the threshold during the decoding process. An embodiment illustrated by FIG. 6 may be used to simulate the decoding process to determine a set of fixed threshold values. Selection of the set of fixed values to use may depend on parameters of the communication channel.

Figure 8:
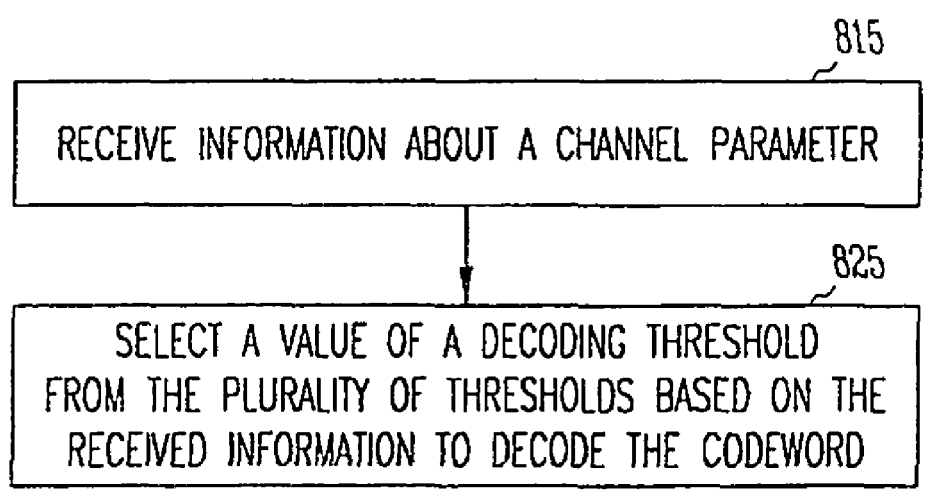
FIG. 8 shows a flow diagram of an embodiment of a method for selecting multiple thresholds to iteratively decode information received from a communication channel.

FIG. 8 shows a flow diagram of an embodiment of a method for selecting multiple thresholds to iteratively decode information received from a communication channel. At 815, information is received in a decoder about a parameter of the channel through which signals containing codewords propagate. The information may provide one or more of a variety of properties such as the SNR or the noise dispersion of the channel. The parameter information may be set in the decoder when the communication channel is constructed. In an embodiment, a parameter of the channel is estimated on a periodic basis and its status provided to a decoder. In an embodiment, a parameter of the channel is estimated on a continual basis and its status is provided to a decoder. Alternatively, the arrival of a signal may automatically initiate sending the parameter information to the decoder. At 825, based on the received information, multiple values for the threshold may be selected from a table, or database, of thresholds to decode the codewords in the received signals. The table or database may be accessed internal or external to the decoder. The values may be selected by querying the table or database prior to receiving the signals. The query may be conducted when the signal arrives. This plurality of decoding thresholds selected from the plurality of thresholds having predefined values calculated before decoding a codeword may be provided to a multi-threshold decoder for decoding.

Figure 9:
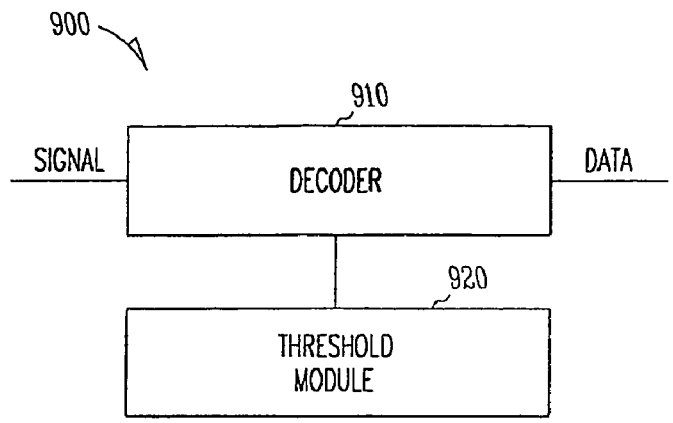
FIG. 9 shows a block diagram of an embodiment of an apparatus having a decoder and threshold module to iteratively decode information using fixed multiple thresholds.

FIG. 9 shows a block diagram of an embodiment of an apparatus 900 having a decoder 910 and threshold module 920 to iteratively decode information using fixed multiple thresholds. Decoder 910 receives a signal from a communication channel and a set of multiple thresholds from threshold module 920 to decode codewords in the signal to provide data. The set of multiple thresholds are fixed before decoder 910 begins decoding the signal. The set of multiple thresholds may include multiple thresholds for each value of a parameter characterizing the channel in which the signal propagates.

Threshold module 920 may be coupled to decoder 910 or may be constructed as an integral part of decoder 910. In an embodiment, threshold module 920 contains a threshold table or a threshold database to store the predetermined threshold value values. These threshold values may be provided to threshold module 920 from an external system that determines threshold values for one or more channel parameters such as for multiple values of a SNR or a noise parameter. In an embodiment, the external system is arranged to simulate a multi-threshold decoder based on a channel parameter. The channel parameter may include the SNR or noise parameter of a communication channel modeled to carry the signal. In an embodiment) threshold module 920 is adapted to determine the multiple thresholds for multiple values of a channel parameter such as a SNR, a noise dispersion, or a mean noise variance. Threshold module 920 may be configured to use simulation techniques in such a determination procedure. The simulation may be modeled as operation of a multi-threshold iterative decoder operating on an AWGN channel.

Figure 10:
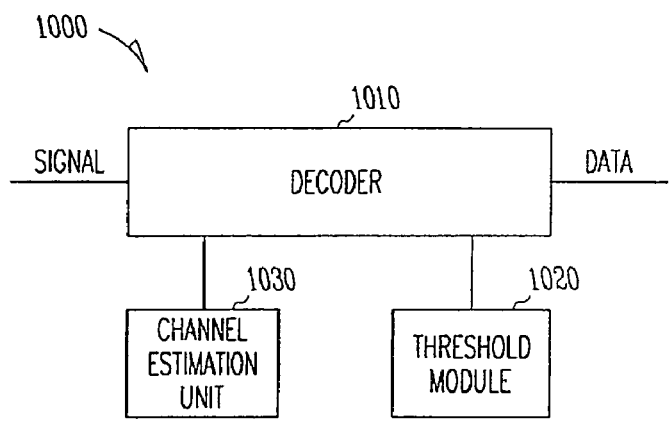
FIG. 10 shows a block diagram of an embodiment of an apparatus having a channel estimation unit to provide information to a decoder to select multiple thresholds to iteratively decode information.

FIG. 10 shows a block diagram of an embodiment of an apparatus 1000 having a channel estimation unit 1030 to provide information to a decoder 1010 to select multiple thresholds to iteratively decode information. Decoder 1010 receives a signal from a communication channel and a set of multiple thresholds from a threshold module 1020 to decode codewords in the signal to provide data. Decoder 1010 may be realized as an embodiment decoder 910 of FIG. 9. Additionally, threshold module 1020 may be realized as an embodiment of threshold module 920 of FIG. 9. The set of multiple thresholds are fixed before decoder 1010 begins decoding the signal. The set of multiple thresholds may include multiple thresholds for each value of a parameter characterizing the channel in which the signal propagates. The parameter characterizing the channel may be provided to decoder 1010 from channel estimation unit 1030.

Channel estimation unit 1030 may be coupled to decoder 1010 or configured as an integral pair of decoder 1030. In an embodiment, channel estimation unit 1030 collects information on one or more characterizing parameters of the communication channel in which the signal is propagating without being in the signal path to decoder 1010. Alternatively, the signal may propagate through channel estimation unit 1030 to decoder 1010. In an embodiment, channel estimation unit 1030 may be adapted to estimate channel parameters on a periodic basis. Channel estimation unit 1030 may be adapted to estimate channel parameters on an almost continual basis.

Figure 11:
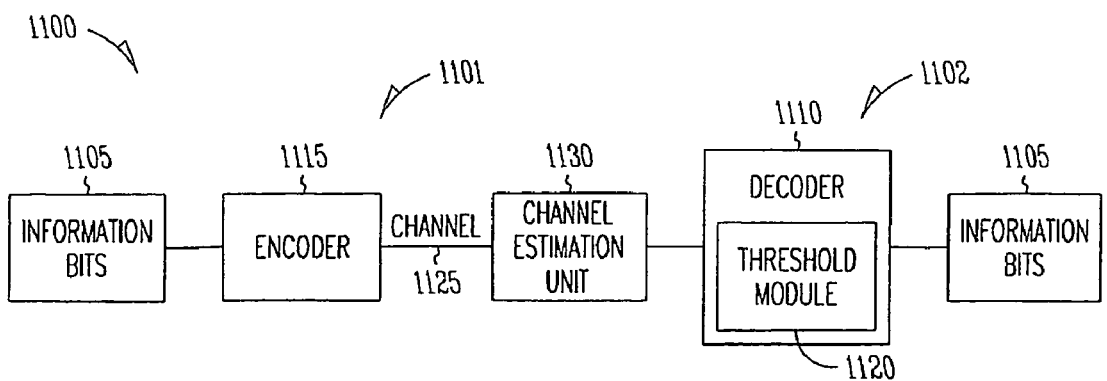
FIG. 11 illustrates a block diagram of an embodiment of a network in which information is encoded at one end of a channel and decoded at another end of the channel.

FIG. 11 illustrates a block diagram of an embodiment of a network 1100 in which information is encoded at one end of a channel 1125 and decoded at another end of channel 1125. Network 1100 includes system 1101 in communication with system 1102 through channel 1125. Data is provided as information bits 1105 to an encoder 1115. Encoder 1115 is adapted to encode information bits 1115 and send the encoded information in a signal onto channel 1125. Encoder 1115 may be adapted to encode the information bits to match a code construction and codeword length expected by a decoder 1110 of system 1102.

System 1102 includes a channel estimation unit 1130 and a threshold module 1120 in addition to decoder 1110 to decode the signal from channel 1125 to provide the information bits 1105 at system 1101 originating from system 1101. Optionally, threshold module 1120 may be realized as an integral part of decoder 1110. In an embodiment, the communication between system 1101 and system 1102 is bi-directional. System 1101 may include a decoder, a threshold module, and a channel estimation unit configured in an embodiment as in system 1102. Likewise, system 1102 may include an encoder in an embodiment as in system 1101.

In an embodiment, a communication network 1100 of FIG. 11 includes a system 1101 for encoding a low-density parity check (LPDC) codeword and a system 1102 for decoding a version of the encoded LDPC codeword received from communication channel 1125. Communication channel 1125 may include, but is not limited to, a fiber optic channel, a wired channel, a channel reading data stored on a memory unit, or a wireless channel. Additionally, embodiments for decoding and encoding may be adapted for use with any protocol for transmission over any communication channel.

Various embodiments for communication network 1100, system 1101, and system 1102 may be realized. System 1101, 1102 may be arranged as network nodes 1101, 1102, respectively, where each node may represent processing systems having a physical layer (PHY) entity arranged to operate in accordance with 10GBase-T as defined by the IEEE 802.3 an series of standards, for example. The 10GBase-T PHY may interface with, for example, a 10G media access control (MAC) and Gigabit Media Independent Interface (XGMII) in an IEEE architecture. The 10GBase-T PHY may include part of a network interface card (NIC), for example. Network nodes 1101, 1102 may include any processing system and/or communications device suitable for use with a 10GBase-T device. For example, network nodes 1101, 1102 may be implemented as a pair of switches, a pair of routers, a pair of servers, a switch and a router, a switch and a server, a server and a router, and so forth. In addition, network nodes 1101, 1102 also may be part of a modular system in which 10GBase-T is the high-speed connection for the system. In an embodiment, each of network nodes 1101, 1102 may include a host system. A host system may provide one or more functions at a node. A host system may direct operations of other systems and/or apparatus at the node. In an embodiment, network nodes 1101, 1102 may include a host system, where the host system is configured as a single host system for both network nodes 1101, 1102. Further examples for network nodes 1101, 1102 may include high-end servers, supercomputers, clusters, grid computing, workgroup switch uplinks, aggregation uplinks, storage systems, and so forth. The embodiments are not limited in this context.

Communication network 1100 may be a land based network using optical fibers, coaxial cable, or wires as a medium for the communication channels between various nodes of communication network 1100. Communication network 1100 may be realized as a wireless network in which systems 1101 and 1102 are configured as part of a node of communication network 1100 or as part of a wireless receiving device that receives signals from the nodes of communication network 1100. System 1101 and system 1102 may be configured as part of, but not limited to, network components such as base stations and may be configured as part of, but not limited to, wireless receiving devices such as handheld communication devices, computers, and laptop computing devices. Though not shown, systems 1101 and 1102 configured in a wireless communication system 1100 include antennas for transmitting and receiving signals that include one more codewords. The decoding and encoding schemes and apparatus do not limit the type or configuration of supporting components such as antennas in the 1101, 1102 systems. In an embodiment, a substantially omnidirectional antenna is utilized.

Each node of communication network 1100 configured as a land based network or as a wireless based network may contain a version of system 101 and/or a version of system 1102 or a system that is a combination of system 1101 and system 1102. Additionally the decoding and encoding processes used in the encoders and decoders of system 1101 and system 1102 and other embodiments for decoding and encoding processes and apparatus as described herein may be adapted for the communication standards and protocols used in communication network 1100.

In an embodiment, scaling may be applied in a reliabilities update procedure for multi-threshold decoding. The procedure of reliabilities updating in a multi-threshold (MT) decoder previously discussed herein uses data from the channel output and the updated reliabilities from the previous decoding iteration. These values are used to obtain the current iteration decoding result and the set of updated reliabilities by adding or subtracting the parity-check reliability to the channel output, depending on whether or not the parity check holds. The channel output effectively may be considered the input of the decoder. Here, there are two types of inputs in the reliabilities updating procedure. The first is the channel output and the second is the result of previous decoding iteration such that the reliabilities updating may be represented by:

$$R_{new} = R_{channel} + \sum_{all\ checks} \pm R_{from\ previous\ iteration}$$

For high SNRs associated with a communication channel, the channel output may be more trustworthy than the results of decoding iterations. In an embodiment, a "trust factor" may be introduced in the procedure of reliabilities update. The "trust factor" may be used to increase the decoding performance.

The "trust factor" may include scaling of the reliabilities of the channel output and scaling of the reliabilities determined from previous iterations. The channel output may have a trust factor (scaling factor) of 1, and the previous decoding iteration results may have a smaller trust factor (scaling factor) K less than 1. Then, updating the reliabilities may be represented by:

$$R_{new} = R_{channel} \cdot 1 + \sum_{all\ checks} \pm R_{from\ previous\ iteration} \cdot K,\ K < 1$$

In an embodiment, a trust factor for the channel output may be assigned a scaling value different from 1. For instance, the channel output may be assigned a scale factor less than one but greater than the scale factor assigned to updating the reliabilities. In an embodiment, the value of the trust factor for the channel output may be assigned different values dependent on the iteration number in the decoding process for a given codeword. In various embodiments, K may have a value set in the range from about 0.68 to about 0.85. In an embodiment, the value of K may be assigned different values dependent on the iteration number in the decoding process for a given codeword. The value of K may be dependent oil a LDPC code construction used in a data communication session and the number of ones in the columns of a LDPC code parity-check matrix associated with a LDPC code construction used. An increase in decoding performance may depend on the code construction implemented in an application. For different LDPC code constructions, setting the value of K in the range from about 0.68 to about 0.85 may increase the decoding performance from 0.1 to 0.4 dB depending on the set of codes selected. There may be optimum values of K for different LDPC code constructions.

Figure 12:
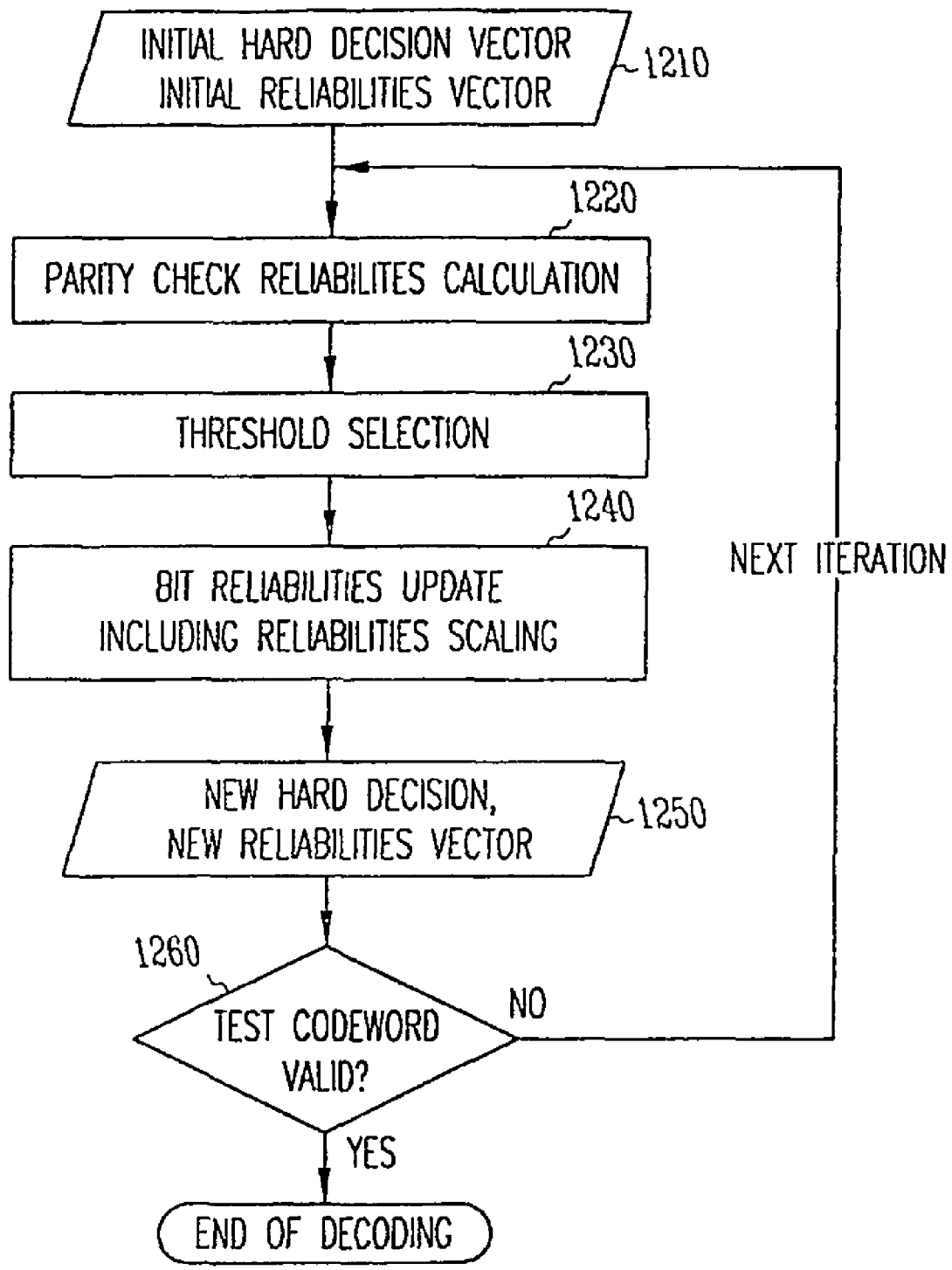
FIG. 12 illustrates features of an embodiment of a method for generalized multi-threshold decoding.

FIG. 12 illustrates features of an embodiment of a method for generalized multi-threshold decoding. Generalized multi-threshold decoding includes using a scaling factor along with multi-threshold decoding. At 1210, an initial hard-decision vector and initial reliabilities vector are obtained. The initial hard-decision vector and initial reliabilities vector may be produced from a soft channel output. At 1220, parity-check reliabilities are calculated. Bit reliabilities may be used to calculate the parity-check reliabilities, where a parity-check reliability may be taken as a minimum bit reliability value of all bits which are involved in the parity check.

At 1230, a threshold may be selected. In an embodiment, the threshold may be calculated during the iterative process. Alternatively, the threshold may be chosen from a set of threshold valves. The set of threshold values may be determined in a simulation procedure that calculates the values in a manner similar to calculating the threshold during the iterative process. The set of threshold values may include a plurality of threshold values for a plurality of LDPC code constructions.

At 1240, bit reliability updating may be performed including scaling of the reliabilities. To recalculate bit reliabilities, a weighted parity-check voting procedure may be used, where the weights are the parity-check reliabilities. Initially the recalculated bit reliability may be assigned a bit reliability, and then parity-check voting is applied to the current hard-decision vector. If the parity check holds, then the recalculated bit reliability is increased by the parity-check reliability value, otherwise, the recalculated bit reliability is decreased by the parity-check reliability value. The recalculated reliabilities are scaled with the scaling coefficient K, K∈[0,1). A threshold value is used for making the decision as to whether the bit and its reliability should be updated. In an embodiment, if the reliability is less than the threshold value, then the hard decision bit is inverted and its new reliability is assigned the absolute value of recalculated reliability.

At 1250, a new hard decision vector, C, is generated based on the updated bit reliabilities. At 1260, the new hard decision vector codeword, acting as a test codeword, may be evaluated for validity. If the following relation occurs, $$CH^T \neq 0$$

the iterative process returns to 1220 using the updated parity check reliability values. In an embodiment, a generalized multiple-threshold decoding scheme as shown in FIG. 12 may be implemented in a manner similar to the method discussed with respect to FIG. 1 or 6 with the additional feature that the bit reliabilities are scaled by a factor, K, in the bit reliability updating process. In such an implementation, the threshold value may be calculated during the iterative process or selected from a set of values determined prior to the decoding of the received codeword.

Embodiments of a generalized multi-threshold (GMT) decoding algorithm having a scaling factor similar to the embodiment illustrated in FIG. 12 may provide an improvement to a multi-threshold decoding scheme illustrated in FIG. 6 for LDPC codes. While an MT decoding scheme may use multiple values of a threshold to provide fast LDPC decoding, a GMT decoding scheme may provide fast LDPC decoding by using a scaling factor along with using multiple values of a threshold.

Figure 13:
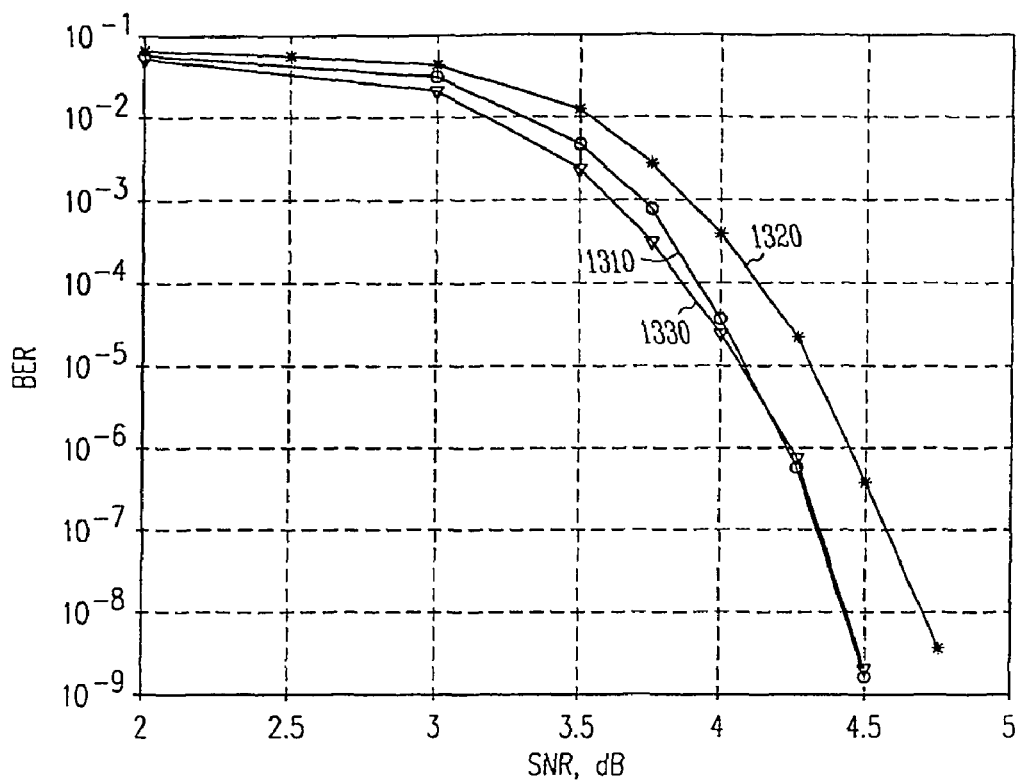
FIG. 13 shows the performance of an embodiment of a generalized multi-threshold decoding scheme, an embodiment of a multi-threshold decoding scheme, and a belief propagation decoding scheme for binary phase shift keying modulation and an additive white Gaussian noise channel in the case of a floating point implementation.

FIG. 13 shows the BER performance of a GMT decoding scheme 1310, a MT decoding scheme 1320, and a belief propagation decoding (BPD) scheme 1330 for binary phase shift keying (BPSK) modulation and an AWGN channel in the case of a floating point implementation. The use of the scaling factor in the GMT decoding algorithm may increase decoding performance compared with the MT decoding by 0.1-0.4 dB. As indicated in FIG. 13, GMT performance 1310 approaches BPD performance of BPD 1330 in a channel with Gaussian noise.

Figure 14:
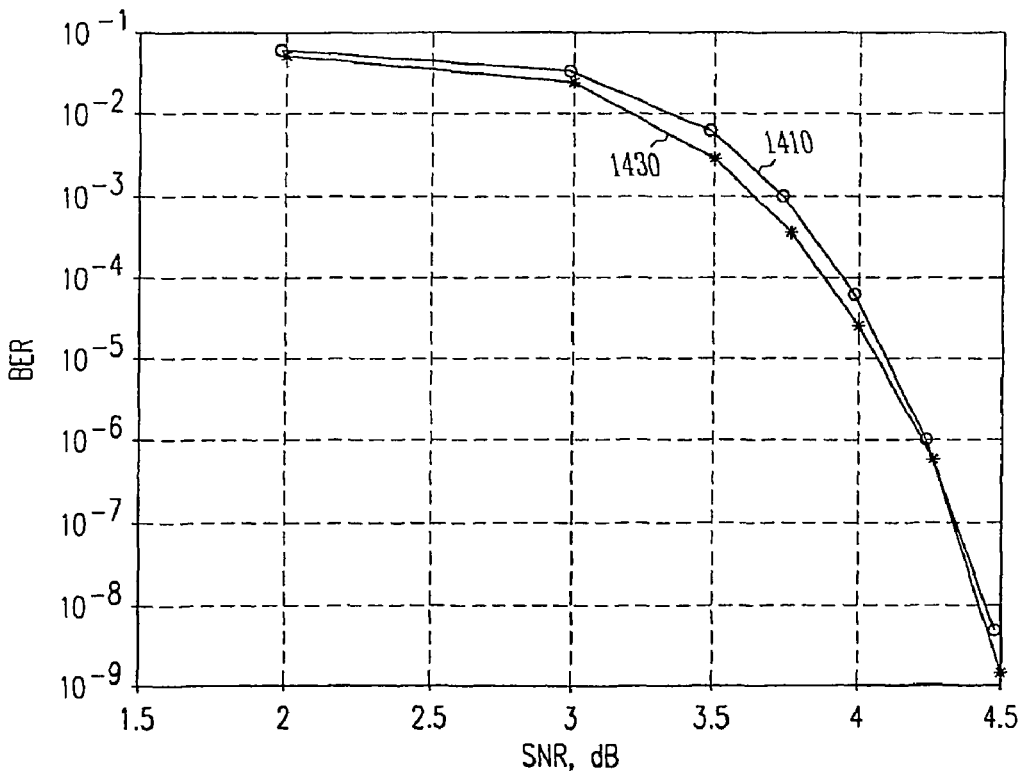
FIG. 14 shows the performance of an embodiment of a generalized multi-threshold decoding scheme and a belief propagation decoding scheme for binary phase shift keying modulation and an additive white Gaussian noise channel in the case of a fixed point implementation.

FIG. 14 shows the BER performance of a GMT decoding scheme 1410 and a BPD scheme 1430 for BPSK modulation and an AWGN channel in the case of a fixed point implementation. As indicated in FIG. 14, GMT performance 1410 approaches BPD performance 1430 in a channel with Gaussian noise. The use of a generalized multi-threshold decoding algorithm is not limited to use with BPSK modulation, but may be used with other modulation. For example, a GMT decoding scheme may be used for a 128 double square (128 DSQ) modulation and AWGN, providing performance that approaches BPD performance for 128 DSQ modulation and AWGN.

A decoder using belief propagation decoding may be considered to provide an optimum symbol decoder. However, issues regarding the complexity of implementation may be associated with a decoder using belief propagation decoding. A decoder using an embodiment of a generalized multi-threshold decoding scheme may be implemented with lower complexity than the complexity of a belief propagation decoder. Reduction in complexity of implementation may result from the use of reliabilities at the input of a GMT decoder. With the use of these reliabilities, the calculation of log-likelihoods ratios (LLRs) may not be required at the input of the decoder. In various embodiments for generalized multi-threshold decoding, while the performance a GMT-based demodulator approaches the performance of a BPD-based demodulator, a GMT-based demodulator may be less complex, since a process to calculate or estimate LLRs in the GMT-based demodulator may not be needed.

In various embodiments, a generalized multi-threshold decoder may be implemented in a variety of electronic apparatus. A GMT decoder may be used in high-speed communication systems, in forward error correction (FEC) for LPDC decoding in 10 Gigabit Ethernet, wireless Ethernet, high-speed modems, and in other applications for transferring information. An embodiment of a GMT decoder may be implemented in 10G BASE-T network cards. A GMT decoding scheme may be implemented in a demodulator providing an operation point of 23.35 dB in AWGN for a low density parity-check FEC on the physical layer of a network using a 2-dimensional 128DSQ mapping with (2048,1723) LDPC code. Such a GMT decoding algorithm may be implemented in a hardware demodulation module of 10G Ethernet network cards, arranged to operate in accordance with 10GBase-T as defined by an Institute of Electrical and Electronics Engineers (IEEE) 802.3 an series of standards, for example.

Various embodiments or combination of embodiments for apparatus and methods for decoding communication signals using a generalized multiple-threshold scheme, as described herein, can be realized in hardware implementations, software implementations, and combinations of hardware and software implementations. These implementations may include a machine-readable medium having machine-executable instructions for performing a decoding method using an embodiment for a scheme having a scaling factor and multiple thresholds to update bit reliabilities for iterative decoding. The machine may be, but is not limited to, a computer. The machine-readable medium is not limited to any one type of medium. The machine-readable medium used will depend on the application using an embodiment of a generalized multiple thresholds scheme. In an embodiment, a processor coupled to a receiver may utilize various forms of memory to which it is coupled and the machine-readable medium to direct decoding of information. In an embodiment, the memory may store parameters used to iteratively decode the received codeword.

Figure 15:
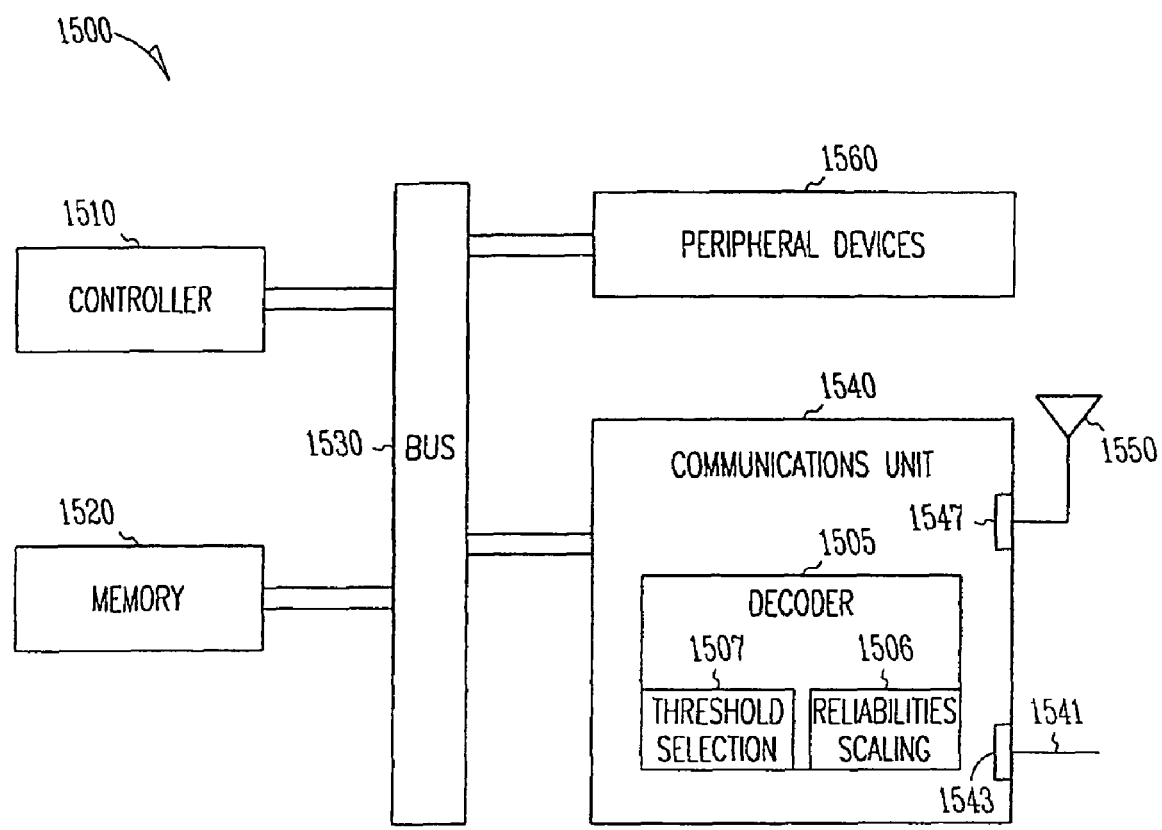
FIG. 15 illustrates a block diagram of an embodiment of a system having a decoder using a generalized multi-threshold decoding scheme.

FIG. 15 illustrates a block diagram of an embodiment of a system 1500 having a decoder 1505 using a GMT decoding scheme. The GMT decoding scheme may use one or more scaling factors to decode a LDPC codeword, where the value of the scale factors may depend on the specific LDPC code construction implemented and/or channel parameters for a given communication session. Decoder 1505 may include threshold selection 1507 and reliabilities scaling 1506: Various embodiments as illustrated in FIGS. 2, 5, and 9-11 may be modified to incorporate the reliabilities scaling of a GMT decoding scheme. Decoder 1505 may be realized with a hardware architecture, a software based architecture, or combination of hardware/software architecture. System 1500 may also include a controller 1510 and a bus 1530, where bus 1530 provides a communication path between controller 1510 and a communication unit 1540. In an embodiment, controller 1510 is a processor. Bus 1530 may be a parallel bus. Bus 1530 may be a serial bus. Bus 1530 may be compatible with Peripheral Component Interconnect (PCI) or with PCI express. An embodiment, system 1500 may include a memory 1520 and an additional peripheral device or devices 1560 coupled to bus 1530. Peripheral devices 1560 may include displays, memory, or other control devices that may operate in conjunction with controller 1510, communication unit 1540, and/or decoder 1505.

Various embodiments for system 1500 may be realized. System 1500 may be arranged as a node, or a component of a node, in a network. The network may have a number of nodes, where each node may represent processing systems having a physical layer (PHY) entity arranged to operate in accordance with 10GBase-T as defined by the IEEE 802.3 an series of standards, for example. The 10GBase-T PHY may interface with, for example, a 10G media access control (MAC) and Gigabit Media Independent Interface (XGMII) in an IEEE architecture. The 10GBase-T PHY may include part of a network interface card (NIC), for example. A network node may be realized as one or more systems. A network node may include any processing system and/or communications device suitable for use with a 10 GBase-T device. For example, network nodes may be implemented as a pair of switches, a pair of routers, a pair of servers, a switch and a router, a switch and a server, a server and a router, and so forth. In addition, network nodes also may be part of a modular system in which 10GBase-T is the high-speed connection for the system. Network nodes may include high-end servers, supercomputers, clusters, grid computing, workgroup switch uplinks, aggregation uplinks, storage systems, and so forth. The embodiments are not limited in this context.

Communication unit 1540 may include decoder 1505. Decoder 1505 may be a separate module in system 1500 operatively coupled to communication unit 1540 to decode messages received from a communication channel. In an embodiment, communication unit 1540 may include a network interface card. In an embodiment, communication unit 1540 may include a communications device suitable for use with a 10GBase-T device. In a wireless embodiment, communication unit 1540 may include a connection 1547 to couple to an antenna 1550. Connection 1547 may provide an input to receive a low-density parity-check codeword. In an embodiment, antenna 1550 may be a substantially omnidirectional antenna. Communication unit 1540 may include a connection 1543 to couple to a transmission medium 1541. Connection 1543 may provide an input to receive a low-density parity-check codeword. Transmission medium 1541 may be an optical fiber medium. Transmission medium 1541 may couple to a wired network. Transmission medium 1541 may be cable. Transmission medium 1541 may include a coaxial cable, an unshielded twisted pair cable, or a shielded twisted pair cable.

System 1500 may include, but is not limited to, information handling devices, wireless systems, telecommunication systems, fiber optic systems, electro-optic systems, and computers. Embodiments for a generalized encoding scheme similar to those described herein may be adapted to be used in a system operating with a communication channel. Such embodiments may be used with an Ethernet channel, including a wireless Ethernet channel. The communication channel may be part of a land based communication network or a wireless communication network. Indeed, embodiments of the present invention may well be implemented as part of any wireless system using multi-carrier wireless communication channels (e.g., orthogonal frequency-division multiplexing (OFDM), discrete multi-tone modulation (DMT), etc.), such as may be used within, without limitation, a wireless personal area network (WPAN), a wireless local area network (WLAN), a wireless metropolitan area network (WMAN), a wireless wide area network (WWAN), a cellular network, a third generation (3G) network, a fourth generation (4G) network, a universal mobile telephone system (UMTS), and similar communication systems.

Although specific embodiments have been illustrated and described herein, it will be appreciated by those of ordinary skill in the alt that any arrangement that is calculated to achieve the same purpose may be substituted for the specific embodiments shown. This application is intended to cover any adaptations or variations of embodiments of the present invention. It is to be understood that the above description is intended to be illustrative, and not restrictive, and that the phraseology or terminology employed herein is for the purpose of description and not of limitation.

What is claimed is:

1. A method comprising:
    operating a decoder using a processor to perform operations to decode a codeword received from a communication channel, the operations including generating a bit reliability to iteratively decode a received codeword including generating the bit reliability based on a summation, the summation including a channel output reliability and an updated bit reliability from a previous decoding iteration, such that for each iteration the bit reliability is updated using a scaling factor with respect to the bit reliability from the previous decoding iteration and a comparison with a threshold, wherein the threshold has a plurality of threshold values during the iterative decoding.

2. The method of claim 1, wherein the method includes selecting the scaling factor based on a predetermined low-density parity check code construction.

3. The method of claim 1, wherein the method includes correcting one or more bits of a test codeword based on a comparison of the updated bit reliability with the threshold to provide a valid codeword, the test codeword initially generated from the received codeword.

4. The method of claim 1, wherein the method includes applying a channel scale factor to generate the channel output reliability to update the bit reliability, the channel scale factor being less than the scaling factor.

5. The method of claim 1, wherein the method includes:
    performing a soft decision process on each bit of the received codeword to generate a received vector from which a hard decision vector and bit reliabilities are generated;
    calculating parity-check reliabilities using the bit reliabilities;
    recalculating the bit reliabilities adjusted by the scaling factor; and
    calculating a value for the threshold.

6. The method of claim 1, wherein the method includes acquiring the plurality of threshold values as predetermined values generated based on a communication channel parameter.

7. The method of claim 1, wherein the method includes acquiring the plurality of threshold values form a set of predetermined values generated based on one or more low-density parity check code constructions.

8. The method of claim 1, wherein the scale factor includes a value in the range from 0.68 to 0.85.

9. The method of claim 1, wherein iteratively decoding a received codeword includes limiting the iteration to a number of iterations, the number of iterations equal to $\log_2 n$, where n is a code length of the codeword.

10. The method of claim 1, where using the comparison with the threshold includes using a threshold value computed by setting the threshold to a value selected from a set of updated bit reliabilities in a decoding activity correlated to decoding the codeword received from the communication channel, the threshold value used to decide whether the bit and its reliability should be updated.

11. A non-transitory machine-readable medium that stores instructions, which when performed by a machine, cause the machine to:
    operate a decoder using a processor to perform operations to decode a codeword received from a communication channel, the operations including operations to generate a bit reliability to iteratively decode a received codeword, the generated bit reliability based on a channel output reliability and an updated bit reliability from a previous decoding iteration such that for each iteration the bit reliability is updated using a scaling factor and a comparison with a threshold, wherein the threshold has a plurality of threshold values during the iterative decoding, generating a bit reliability to iteratively decode a received codeword including generating the bit reliability based on a summation, the summation including a channel output reliability and an updated bit reliability from a previous decoding iteration, such that for each iteration the bit reliability is updated using a scaling factor with respect to the bit reliability from the previous decoding iteration and a comparison with a threshold, wherein the threshold has a plurality of threshold values during the iterative decoding.

12. The non-transitory machine-readable medium of claim 11, wherein the instructions include instructions to correct one or more bits of a test codeword initially generated from the received codeword to provide a valid codeword.

13. The non-transitory machine-readable medium of claim 11, wherein the instructions include instructions to provide a message word from the received codeword after iteratively decoding the received codeword.

14. The non-transitory machine-readable medium of claim 11, wherein the instructions include instructions to:
    perform a soft decision process on each bit of the received codeword to generate a received vector from which a hard decision vector and bit reliabilities are generated;

calculate parity-check reliabilities using the bit reliabilities;

recalculate the bit reliabilities adjusted by the scaling factor; and calculate a value for the threshold.

15. The non-transitory machine-readable medium of claim 11, wherein the instructions include instructions to acquire the plurality of threshold values form a set of predetermined values generated based on one or more low-density parity check code constructions.

16. The non-transitory machine-readable medium of claim 11, wherein the scale factor includes a value in the range from 0.68 to 0.85.

17. An apparatus comprising:
a processor;
a decoder arranged with the processor to iteratively decode a received codeword from a communication channel, the decoder including:
a bit reliability generator to provide a set of bit reliabilities, each bit reliability corresponding to a bit of a received codeword acquired by the receiver; and
a comparison unit using a threshold such that, for each iteration of an iterative process to decode the received codeword, the bit reliability is updated based on a summation, the summation including a channel output reliability and a bit reliability from a previous decoding iteration, such that for each iteration the bit reliability is updated using a scaling factor with respect to the bit reliability from the previous decoding iteration and a comparison with the threshold, wherein the threshold has a plurality of threshold values during the iterative decoding.

18. The apparatus of claim 17, wherein the apparatus includes a threshold unit to store the plurality of threshold values as predetermined values generated based on a communication channel parameter.

19. The apparatus of claim 17, wherein the apparatus includes a threshold unit to store the plurality of threshold values as predetermined values generated based on one or more low-density parity check code constructions.

20. The apparatus of claim 17, wherein the scale factor includes a value in the range from 0.68 to 0.85.

21. The apparatus of claim 17, wherein the apparatus includes a 10G Base-T network card in which the decoder is disposed.

22. The apparatus of claim 17, where the plurality of threshold values includes a threshold value selected from a set of updated bit reliabilities in a decoding activity correlated to the decode of the received codeword.

23. A system comprising:
a controller;
a parallel bus; and
a decoder communicatively coupled to the controller through the parallel bus, the decoder to iteratively decode a received codeword, the decoder including:
a bit reliability generator to provide a set of bit reliabilities, each bit reliability corresponding to a bit of a received codeword acquired by the receiver; and
a comparison unit using a threshold such that, for each iteration of an iterative process to decode the received codeword, the bit reliability is updated based on a summation, the summation including a channel output reliability and a bit reliability from a previous decoding iteration, such that for each iteration the bit reliability is updated using a scaling factor with respect to the bit reliability from the previous decoding iteration and a comparison with the threshold, wherein the threshold has a plurality of threshold values during the iterative decoding.

24. The system of claim 23, wherein the system includes a machine-readable medium that stores instructions, which when performed by the system, cause the system to control the decoder to iteratively decode the received codeword.

25. The system of claim 24, wherein the instructions include instructions to generate the plurality of threshold values.

26. The system of claim 23, wherein the system includes memory to store the plurality of threshold values as predetermined values generated based on a communication channel parameter.

27. The system of claim 23, wherein the system includes a threshold unit to store the plurality of threshold values as predetermined values generated based on one or more low-density parity check code constructions.

28. The system of claim 23, wherein the scale factor includes a value in the range from 0.68 to 0.85.

29. The system of claim 23, wherein the system includes memory to store multiple values of the scale factor.

30. The system of claim 23, wherein the network interface card includes a 10GBase-T network card.

31. The system of claim 23, wherein the decoder includes an output to provide a codeword decoded from a received low-density parity check code.

* * * * *